United States Patent
Rabkin et al.

(10) Patent No.: US 9,443,907 B2
(45) Date of Patent: Sep. 13, 2016

(54) VERTICAL BIT LINE WIDE BAND GAP TFT DECODER

(71) Applicant: SanDisk 3D LLC, Milpitas, CA (US)

(72) Inventors: Peter Rabkin, Cupertino, CA (US); Masaaki Higashitani, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/793,167

(22) Filed: Jul. 7, 2015

(65) Prior Publication Data

US 2015/0311256 A1    Oct. 29, 2015

Related U.S. Application Data

(62) Division of application No. 14/020,647, filed on Sep. 6, 2013, now Pat. No. 9,105,468.

(51) Int. Cl.
*H01L 27/24* (2006.01)
*H01L 21/02* (2006.01)
(Continued)

(52) U.S. Cl.
CPC ......... *H01L 27/2454* (2013.01); *G11C 13/003* (2013.01); *G11C 13/0026* (2013.01); *G11C 13/0033* (2013.01); *H01L 21/02403* (2013.01); *H01L 21/02565* (2013.01); *H01L 27/124* (2013.01); *H01L 27/127* (2013.01); *H01L 27/1259* (2013.01); *H01L 27/249* (2013.01); *H01L 27/2481* (2013.01); *H01L 29/24* (2013.01); *H01L 29/66969* (2013.01); *H01L 29/7869* (2013.01); *H01L 29/78642* (2013.01);

(Continued)

(58) Field of Classification Search
CPC .................... H01L 29/66969; H01L 29/7869; H01L 29/24
See application file for complete search history.

(56) References Cited

U.S. PATENT DOCUMENTS

| 5,668,391 A | 9/1997 | Kim et al. |
| 6,917,532 B2 | 7/2005 | Van Brocklin et al. |

(Continued)

FOREIGN PATENT DOCUMENTS

| JP | H05160408 A | 6/1993 |
| WO | WO2003040441 A1 | 5/2003 |

(Continued)

OTHER PUBLICATIONS

Notice of Allowance dated Oct. 7, 2015, U.S. Appl. No. 14/020,621, filed Sep. 6, 2013.

(Continued)

*Primary Examiner* — Matthew Reames
(74) *Attorney, Agent, or Firm* — Vierra Magen Marcus LLP

(57) ABSTRACT

A 3D memory array having a vertically oriented thin film transistor (TFT) selection device that has a body formed from a wide energy band gap semiconductor is disclosed. The wide energy band gap semiconductor may be an oxide semiconductor, such as a metal oxide semiconductor. As examples, this could be an InGaZnO, InZnO, HfInZnO, or ZnInSnO body. The source and drains can also be formed from the wide energy band gap semiconductor, although these may be doped for better conduction. The vertically oriented TFT selection device serves as a vertical bit line selection device in the 3D memory array. A vertical TFT select device has a high drive current, a high breakdown voltage and low leakage current.

20 Claims, 31 Drawing Sheets

(51) Int. Cl.
| | |
|---|---|
| H01L 27/12 | (2006.01) |
| G11C 13/00 | (2006.01) |
| H01L 29/786 | (2006.01) |
| H01L 45/00 | (2006.01) |
| H01L 29/24 | (2006.01) |
| H01L 29/66 | (2006.01) |

(52) U.S. Cl.
CPC .............. *H01L 45/06* (2013.01); *H01L 45/08* (2013.01); *H01L 45/085* (2013.01); *H01L 45/10* (2013.01); *H01L 45/1226* (2013.01); *H01L 45/1266* (2013.01); *H01L 45/144* (2013.01); *H01L 45/146* (2013.01); *H01L 45/147* (2013.01); *H01L 45/149* (2013.01); *H01L 45/16* (2013.01); *G11C 2213/71* (2013.01); *G11C 2213/77* (2013.01)

(56) References Cited

U.S. PATENT DOCUMENTS

| | | |
|---|---|---|
| 7,061,014 B2 | 6/2006 | Hosono et al. |
| 7,256,458 B2 | 8/2007 | Nowak |
| 7,489,002 B2 | 2/2009 | Forbes et al. |
| 8,003,457 B2 | 8/2011 | Chen |
| 8,363,452 B2 | 1/2013 | Yamazaki et al. |
| 8,385,105 B2 | 2/2013 | Saito |
| 8,658,523 B2 | 2/2014 | Faulkner et al. |
| 8,923,048 B2 | 12/2014 | Rabkin et al. |
| 2004/0159868 A1 | 8/2004 | Rinerson et al. |
| 2006/0197153 A1 | 9/2006 | Huang et al. |
| 2006/0250837 A1 | 11/2006 | Herner et al. |
| 2008/0093595 A1 | 4/2008 | Song et al. |
| 2008/0175032 A1 | 7/2008 | Tanaka et al. |
| 2008/0217678 A1 | 9/2008 | Tan et al. |
| 2009/0294751 A1 | 12/2009 | Kiyotoshi |
| 2010/0155858 A1 | 6/2010 | Chen |
| 2011/0101356 A1 | 5/2011 | Yamazaki |
| 2011/0194332 A1 | 8/2011 | Saito |
| 2011/0261606 A1* | 10/2011 | Sandhu et al. ............... 365/148 |
| 2012/0147644 A1 | 6/2012 | Scheuerlein |
| 2012/0147648 A1 | 6/2012 | Scheuerlein |
| 2012/0147649 A1 | 6/2012 | Samachisa et al. |
| 2012/0147650 A1 | 6/2012 | Samachisa |
| 2012/0175581 A1* | 7/2012 | Hwang ............................ 257/2 |
| 2012/0181534 A1 | 7/2012 | Hatano |
| 2012/0228688 A1 | 9/2012 | Matsubayashi |
| 2013/0170283 A1 | 7/2013 | Lan et al. |
| 2013/0228839 A1 | 9/2013 | Arai |
| 2013/0234101 A1 | 9/2013 | Sasago et al. |
| 2014/0048761 A1 | 2/2014 | Nojiri et al. |
| 2014/0252454 A1 | 9/2014 | Rabkin et al. |
| 2015/0069320 A1 | 3/2015 | Rabkin et al. |
| 2015/0069377 A1 | 3/2015 | Rabkin et al. |

FOREIGN PATENT DOCUMENTS

| | | |
|---|---|---|
| WO | WO2005088727 A1 | 9/2005 |
| WO | WO2010117912 A1 | 10/2010 |
| WO | WO2012082770 A1 | 6/2012 |
| WO | WO2012082775 A1 | 6/2012 |

OTHER PUBLICATIONS

Non-final Office Action dated Jul. 10, 2015, U.S. Appl. No. 14/020,621, filed Sep. 6, 2013.
Notice of Allowance dated Jun. 5, 2015, U.S. Appl. No. 13/788,990, filed Mar. 7, 2013.
Response to Office Action dated Sep. 10, 2015, U.S. Appl. No. 14/020,621, filed Sep. 6, 2013.
International Preliminary Report of Patentability dated Sep. 8, 2015, International Application No. PCT/US2014/018125.
International Preliminary Report on Patentability dated Mar. 8, 2016, International Application No. PCT/US2014/054080.
International Preliminary Report on Patentability dated Mar. 8, 2016, International Application No. PCT/US2014/054076.
Fobelets, et al., "A novel 3D embedded gate field effect transistor—Screen-grid FET—Device concept and modeling," Solid State Electronics, vol. 51, No. 5, May 1, 2007, pp. 749-756.
Kaneko et al., "Highly Reliable BEOL-Transistor with Oxygen-controlled InGaZnO and Gate/Drain Offset Design for High/Low Voltage Bridging I/O Operations", Electron Devices Meeting (IEDM), 2011 IEEE International, Dec. 2011, pp. 7.4.1-7.4.4, 4 pages.
Park et al., "High performance amorphous oxide thin film transistors with self-aligned top-gate structure", Electron Devices Meeting (IEDM), 2009 IEEE International, Dec. 2009, pp. 8.4.1-8.4.4, 4 pages.
Hosono, Hideo, "High Performance Thin-film Transistor (TFT) with Amorphous InGaZnO4 Semiconductor", published date unknown, 1 page.
Kaneko, et al., "A Novel BEOL Transistor (BETr) with InGaZnO Embedded in Cu-Interconnects for On-chip High Voltage I/Os in Standard CMOS LSIs", 2011 Symposium on VLSI Technology (VLSIT), Jun. 2011, pp. 120-121, 2 pages.
Noh, et al., "A New Metal Control Gate Last Process (MCGL process) for High Performance DC-SF (Dual Control gate with Surrounding Floating gate) 3D NAND Flash Memory", 2012 Symposium on VLSI Technology Digest of Technical Papers, Jun. 2012, pp. 19-20, 2 pages.
Jang, et al., "Vertical Cell Array using TCAT(Terabit Cell Array Transistor) Technology for Ultra High Density NAND Flash Memory", 2009 Symposium on VLSI Technology Digest of Technical Papers, Jun. 2009, pp. 192-193, 2 pages.
Kaneko, et al., "Operation of Functional Circuit Elements using BEOL-Transistor with InGaZnO Channel for On-chip High/Low Voltage Bridging I/Os and High-Current Switches", 2012 Symposium on VLSI Technology Digest of Technical Papers, Jun. 2012, pp. 123-124, 2 pages.
Tsai et al., "Influence of positive bias stress on N2O plasma improved InGaZnO thin film transistor", Applied Physics Letters, vol. 96, Issue 242105, American Institute of Physics, Mar. 2010, 3 pages.
Chen, et al. "Bias-induced oxygen adsorption in zinc tin oxide thin film transistors under dynamic stress", Applied Physics Letters, vol. 96, Issue 262104, American Institute of Physics, May 2010, 3 pages.
Chen et al., "Light-induced instability of an InGaZnO thin film transistor with and without SiOx passivation layer formed by plasma-enhanced-chemical-vapor-deposition", Applied Physics Letters, vol. 97, Issue 192103, American Institute of Physics, Sep. 2010, 3 pages.
Restriction dated Feb. 5, 2014, U.S. Appl. No. 13/788,990, filed Mar. 7, 2013.
Restriction dated Apr. 2, 2014, U.S. Appl. No. 13/788,990, filed Mar. 7, 2013.
Restriction dated Jul. 17, 2014, U.S. Appl. No. 14/020,647, filed Sep. 6, 2013.
Response to Restriction dated Sep. 10, 2014, U.S. Appl. No. 14/020,647, filed Sep. 6, 2013.
Office Action dated May 8, 2014, U.S. Appl. No. 13/788,990, filed Mar. 7, 2013.
Response to Office Action dated Aug. 8, 2014, U.S. Appl. No. 13/788,990, filed Mar. 7, 2013.
Notice of Allowance dated Sep. 18, 2014, U.S. Appl. No. 13/788,990, filed Mar. 7, 2013.
International Search Report & The Written Opinion of the International Searching Authority dated Sep. 29, 2014. International Application No. PCT/US2014/018125.
English Abstract of Japanese Publication No. JPH05160408 published Jun. 26, 1993.
Office Action dated Nov. 28, 2014, U.S. Appl. No. 14/020,647, filed Sep. 6, 2013.
International Search Report & The Written Opinion of the International Searching Authority dated Nov. 18, 2014, International Application No. PCT/US2014/054080.

(56) References Cited

OTHER PUBLICATIONS

Response to Office Action dated Feb. 6, 2015, U.S. Appl. No. 14/020,647, filed Sep. 6, 2013.

Restriction dated Mar. 2, 2015, U.S. Appl. No. 14/020,621, filed Sep. 6, 2013.

Notice of Allowance dated Apr. 7, 2015, U.S. Appl. No. 14/020,647, filed Sep. 6, 2013.

Response to Restriction dated Apr. 8, 2015, U.S. Appl. No. 14/020,621, filed Sep. 6, 2013.

* cited by examiner

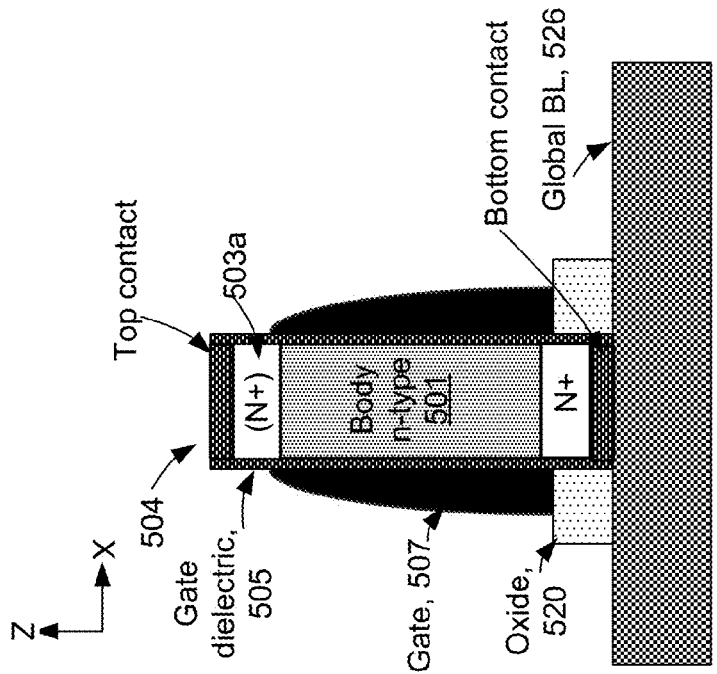
Figure 11B1
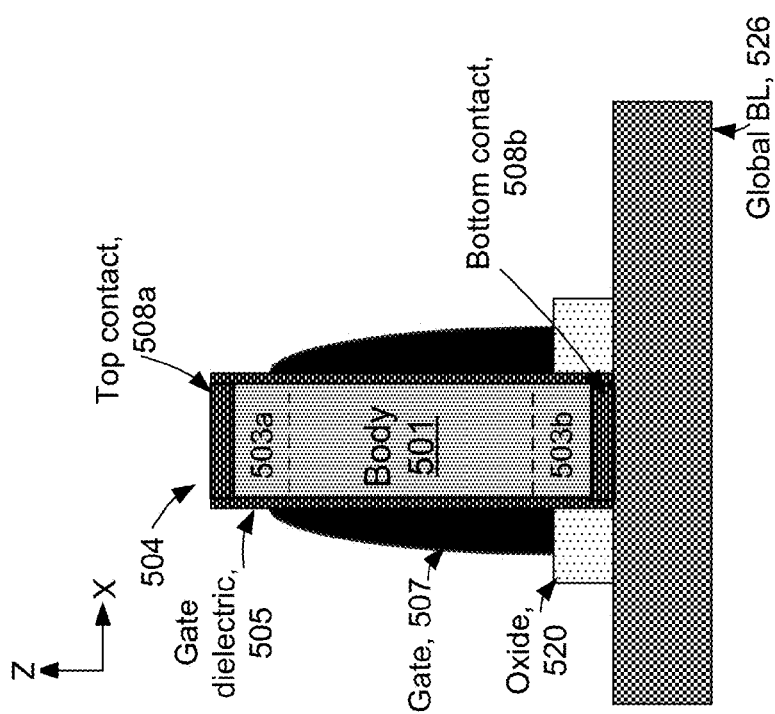
Figure 11A

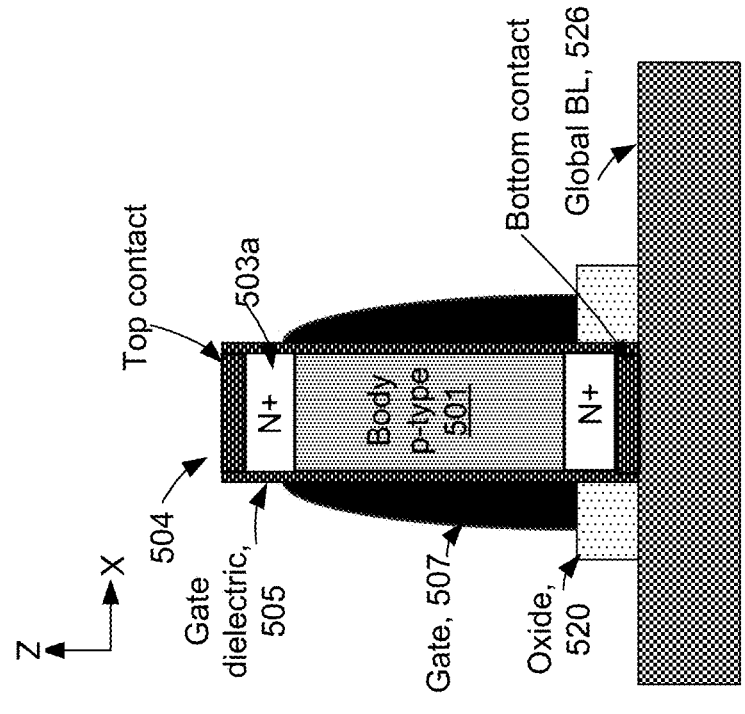
Figure 11B3
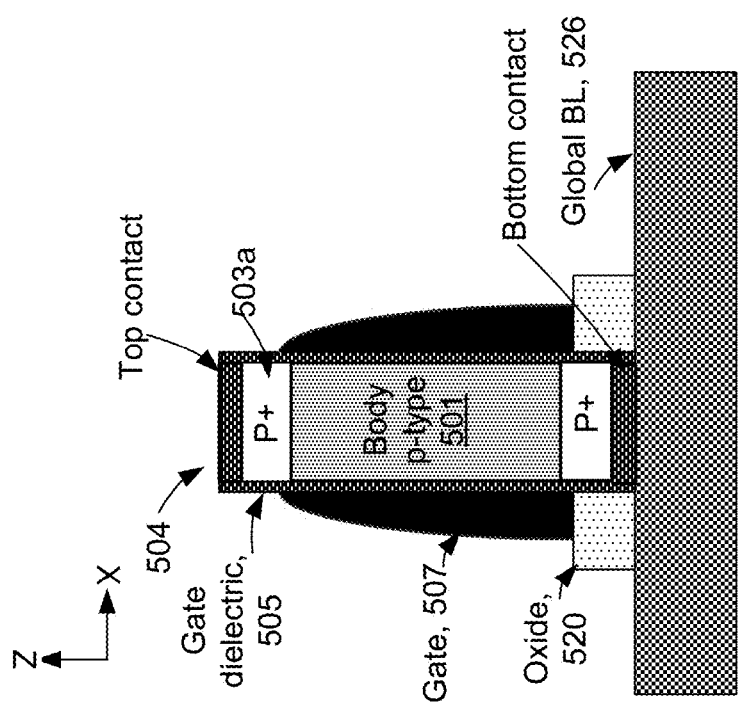
Figure 11B2

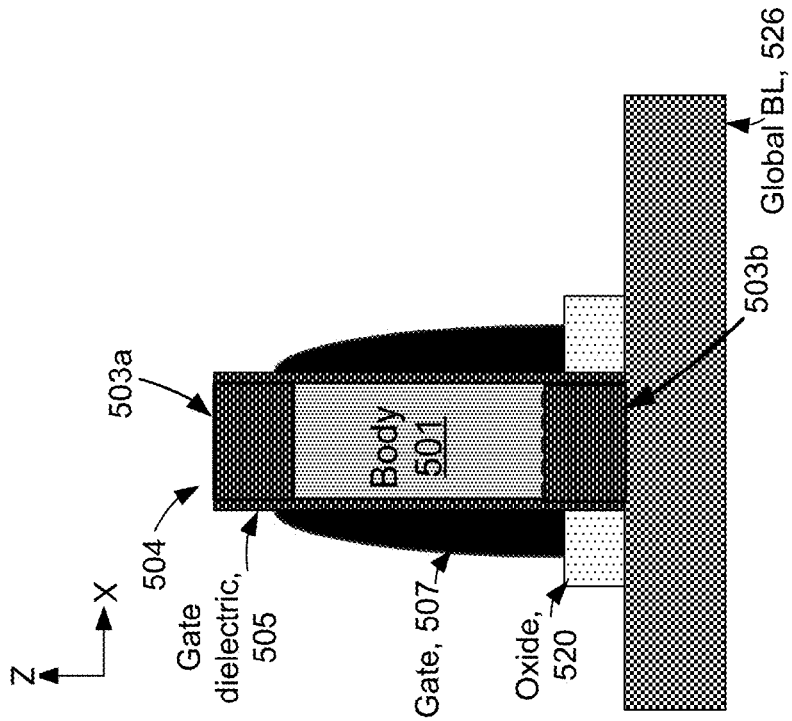
Figure 11B5
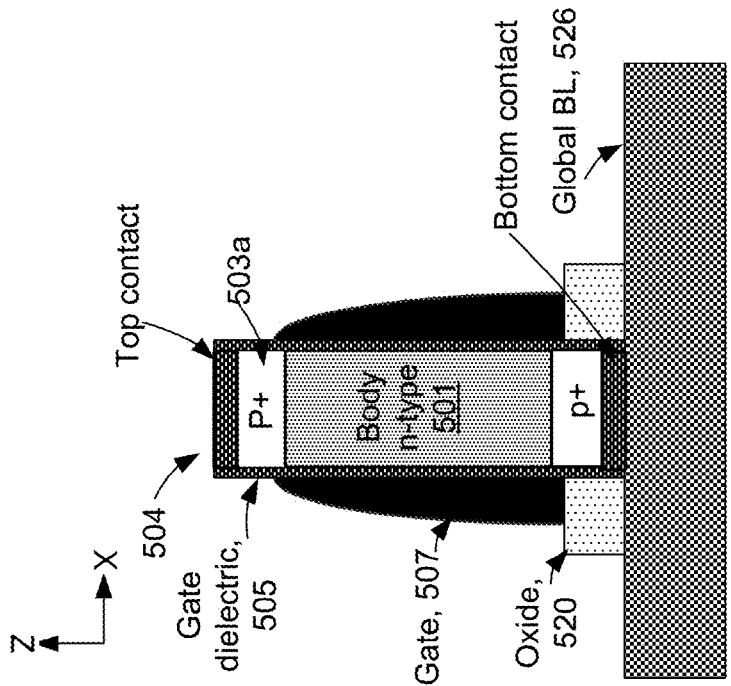
Figure 11B4

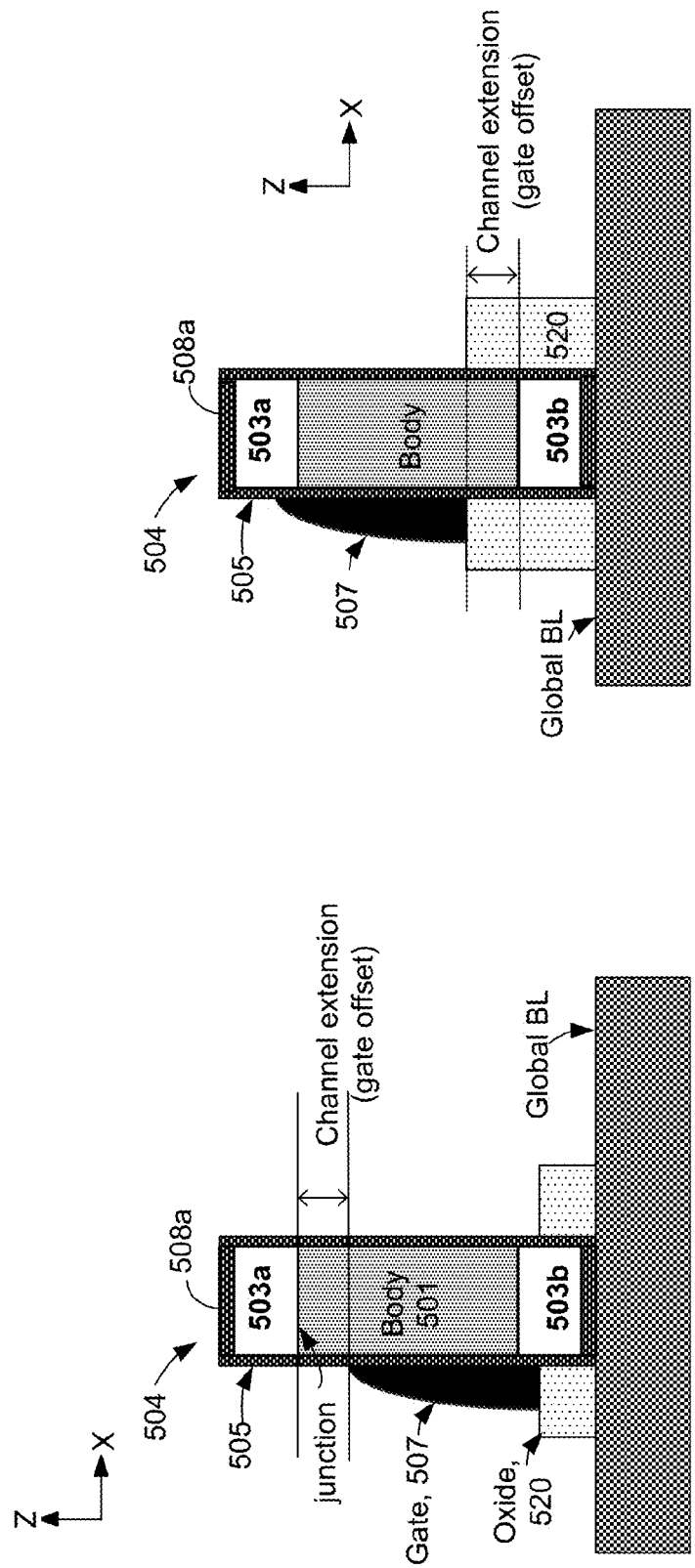

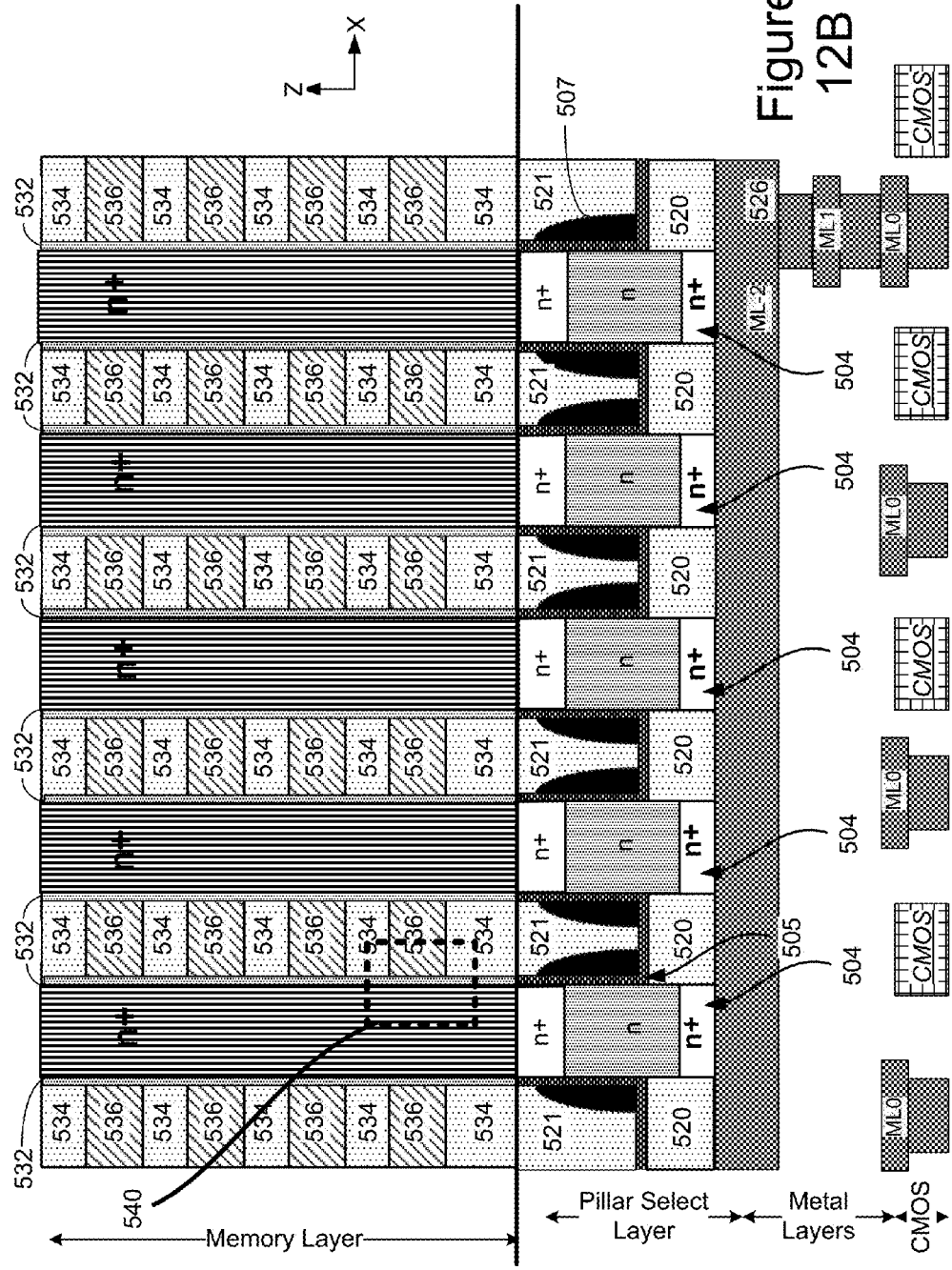

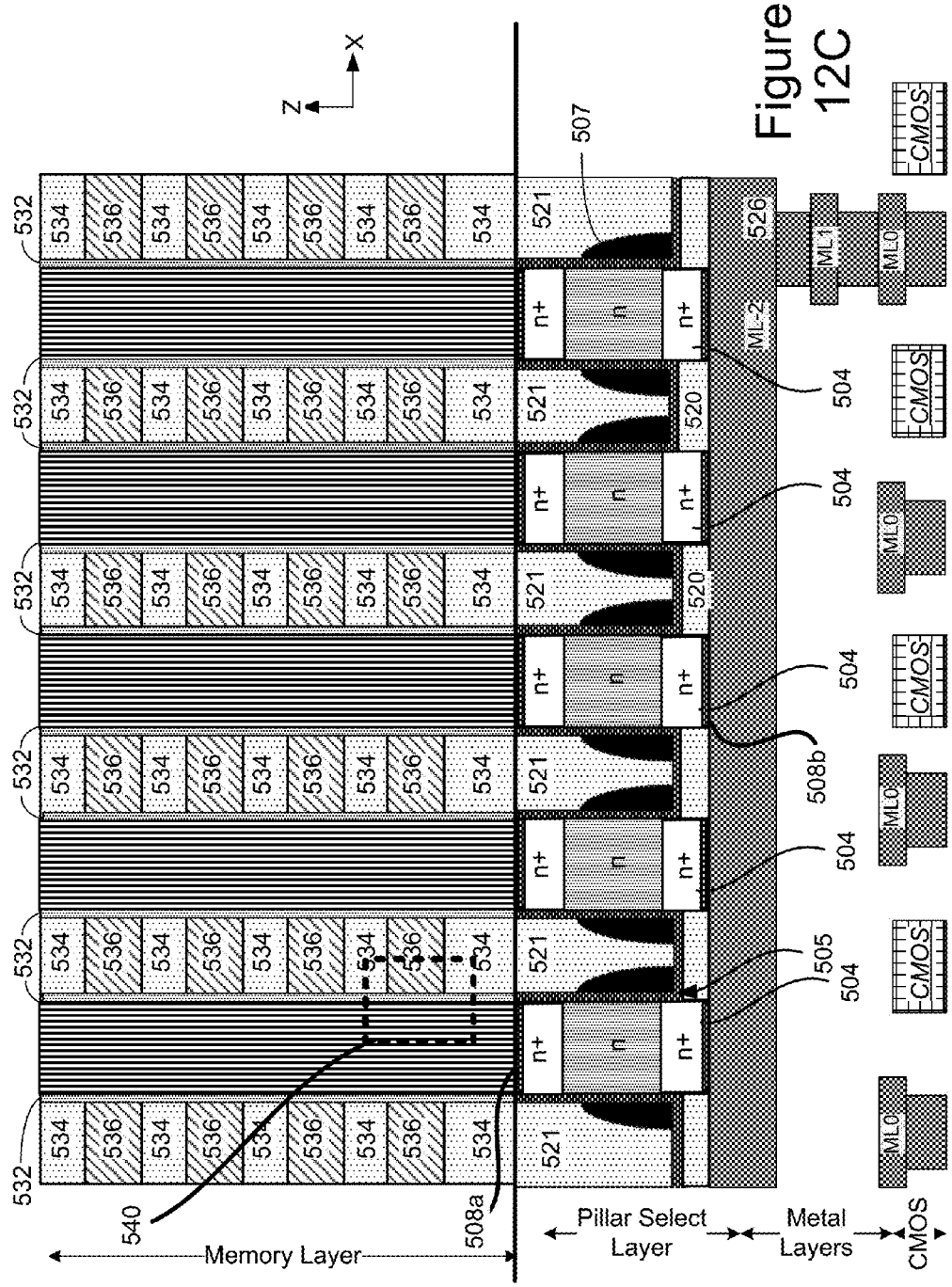

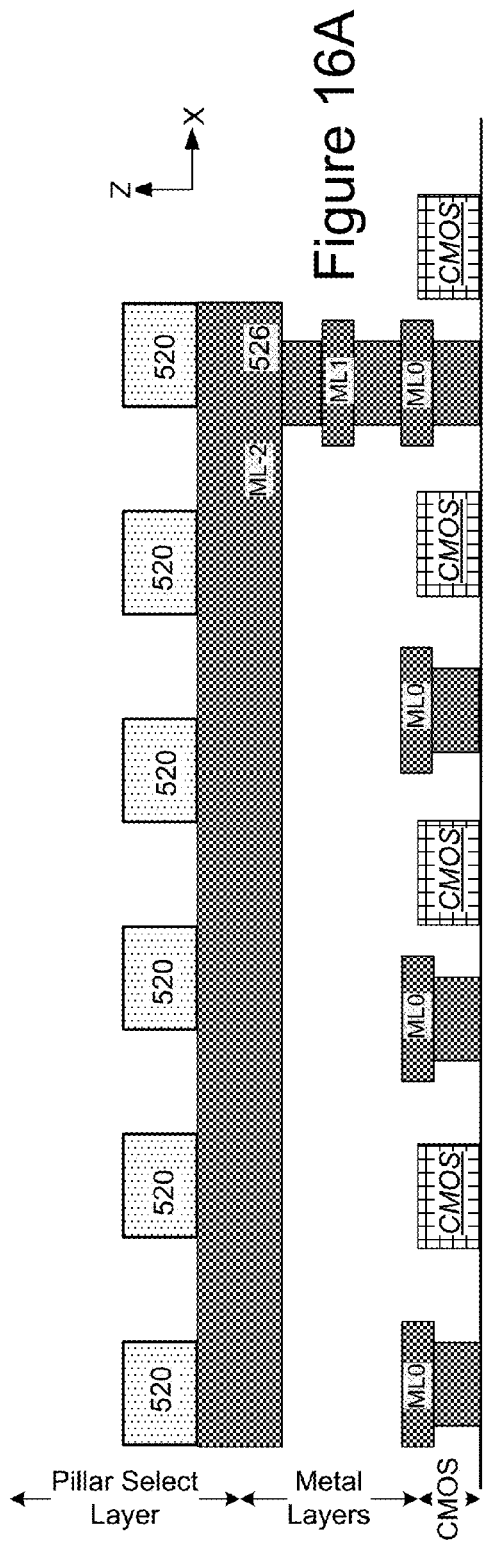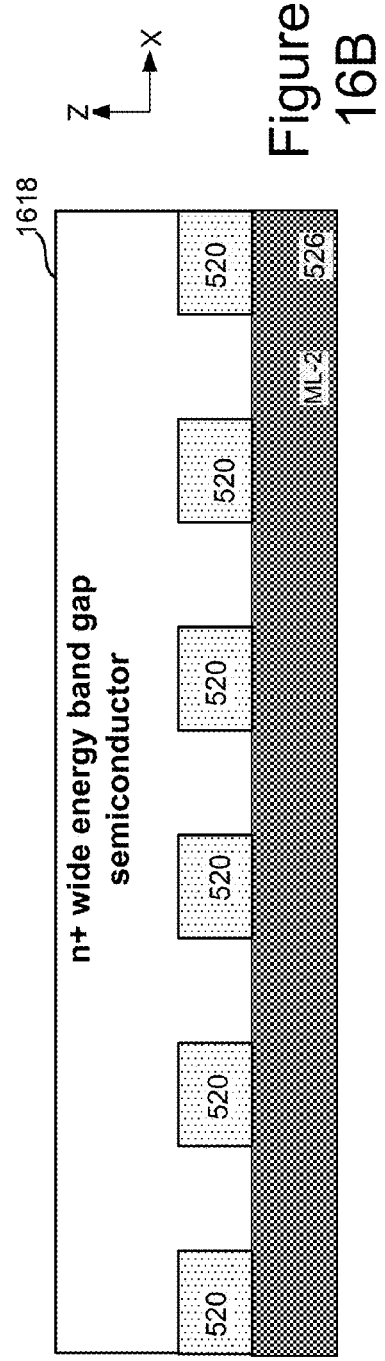

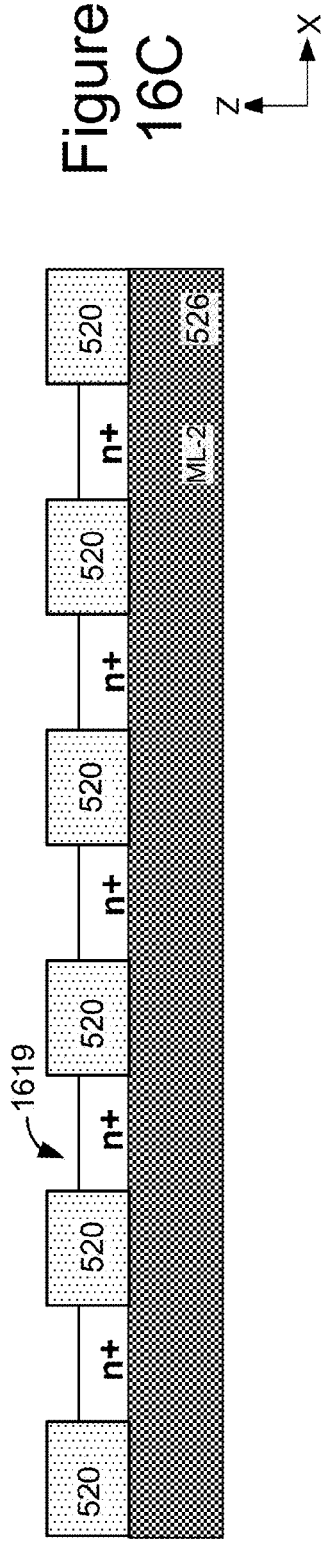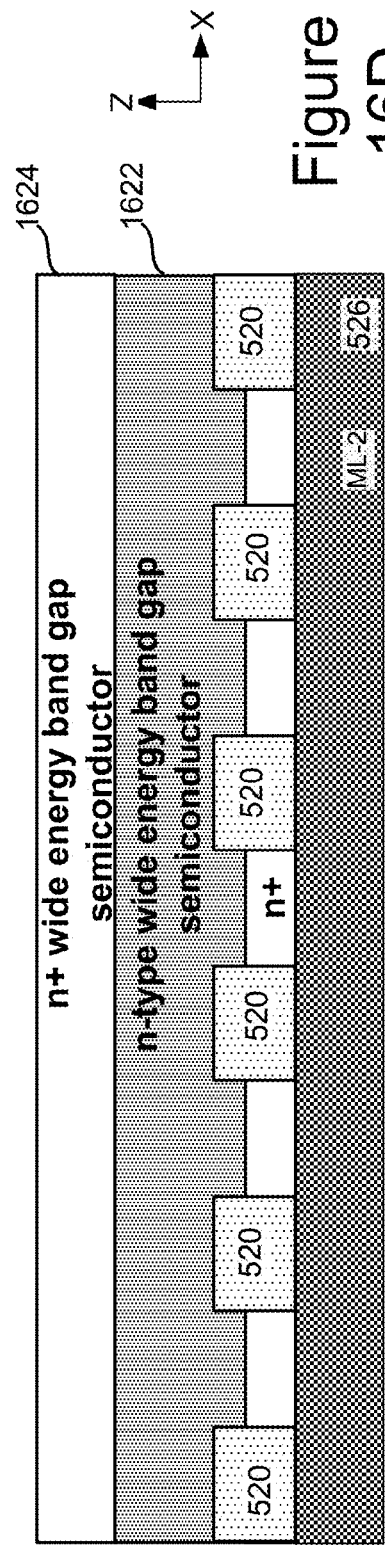

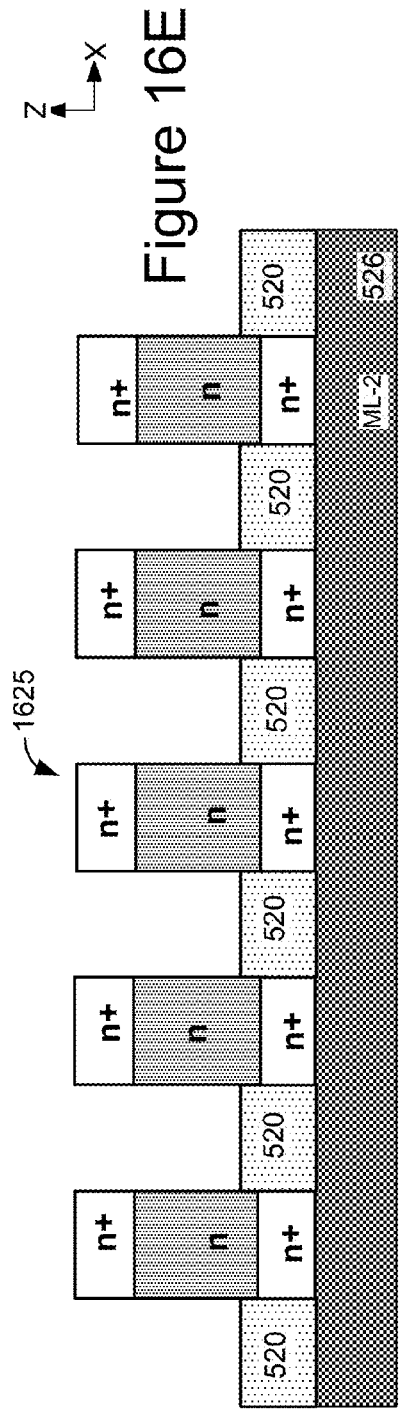
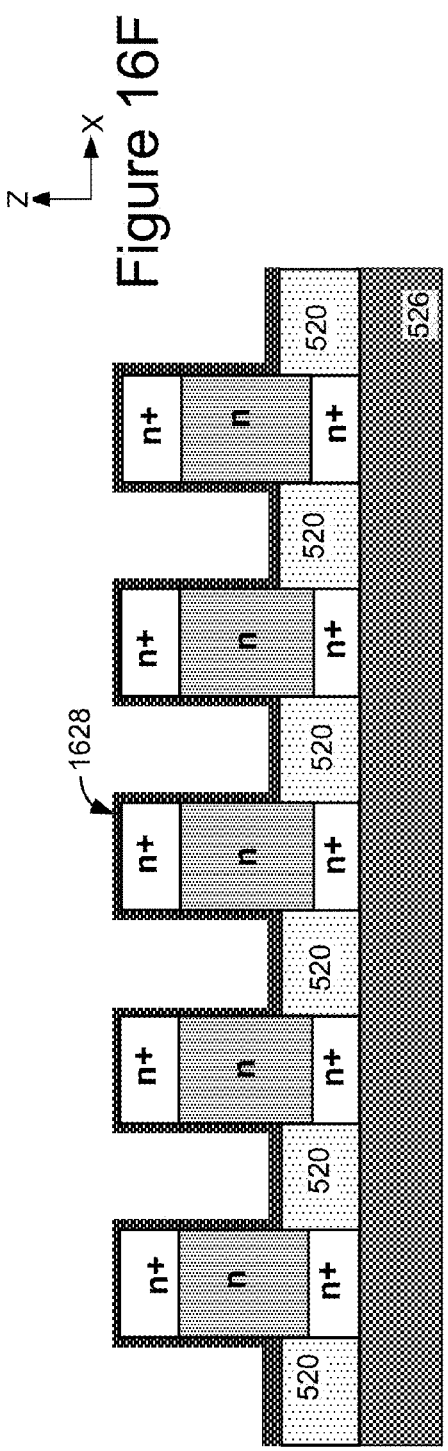

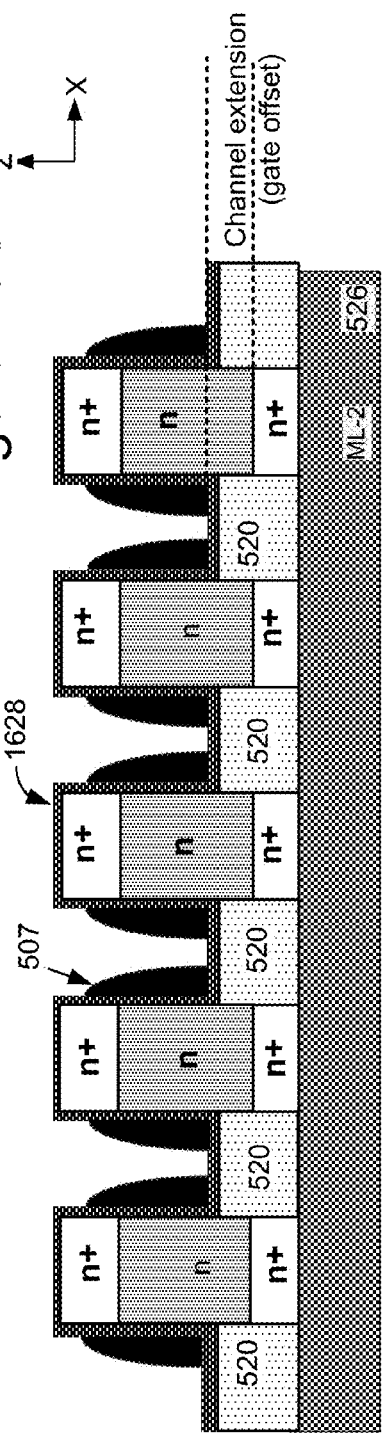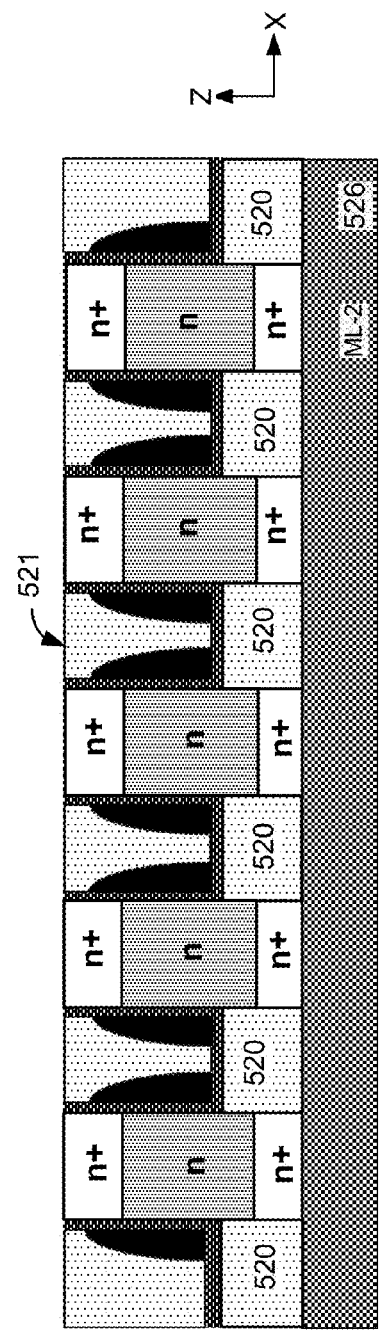

VERTICAL BIT LINE WIDE BAND GAP TFT DECODER

CLAIM OF PRIORITY

This application is a divisional application of U.S. patent application Ser. No. 14/020,647, entitled "VERTICAL BIT LINE WIDE BAND GAP TFT DECODER," by Rabkin et al., filed Sep. 6, 2013, published as US 2015/0069320 on Mar. 12, 2015 and issued as U.S. Pat. No. 9,105,468 on Aug. 11, 2015) incorporated by reference herein in its entirety.

BACKGROUND

The present disclosure relates to technology for non-volatile storage.

One example of non-volatile memory uses variable resistance memory elements that may be set to either low or high resistance states. Upon application of sufficient voltage, current, or other stimulus, the variable resistance memory element switches to a stable low-resistance state, which is sometimes referred to as SETTING the device. This resistivity-switching is reversible such that subsequent application of an appropriate voltage, current, or other stimulus can serve to return the reversible resistivity-switching material to a stable high-resistance state, which is sometimes referred to as RESETTING the device. This conversion can be repeated many times.

The variable resistance memory elements may be in a high resistance state when first manufactured. This may be referred to as the "virgin state." In the virgin state, the resistance could be even higher than for the RESET state. The term "FORMING" is typically used to describe putting the variable resistance memory elements into a lower resistance state for the first time. For some memory elements, the FORMING operation requires a higher voltage than the SET and/or RESET operations.

3D memory arrays having variable resistance memory elements have been proposed. In one possible architecture, word lines extend horizontally and bit lines extend vertically. There a multiple levels of the word lines, hence multiple levels of memory elements. Each memory element is located between one of the vertical bit lines and one of the horizontal word lines. During operation, some of the memory cells are selected for the SET, RESET, or FORM operation, while others are unselected.

BRIEF DESCRIPTION OF THE DRAWINGS

FIG. 11A depict one embodiment of a vertical TFT selection device.

FIG. 11B1 depicts one embodiment of vertical TFT selection device that is N+/n/N+.

FIG. 11B2 depicts one embodiment of vertical TFT selection device that is P+/p/P+.

FIG. 11B3 depicts one embodiment of vertical TFT selection device that is N+/p/N+.

FIG. 11B4 depicts one embodiment of vertical TFT selection device that is P+/n/P+.

FIG. 11B5 depicts one embodiment of vertical TFT selection device that is metal-wide band gap semiconductor-metal.

FIGS. 11C-11F depict various embodiments of vertical TFT selection devices with channel extensions.

FIG. 12B is a cross-sectional view of another embodiment of a memory structure using the vertically oriented TFT select device and the memory structure of FIG. 6.

FIG. 12C is a cross-sectional view of another embodiment of a memory structure using the vertically oriented TFT select device and the memory structure of FIG. 6.

FIGS. 16A-16H depict the structure of FIG. 12B during the process of FIG. 15A.

DETAILED DESCRIPTION

Figure 1:
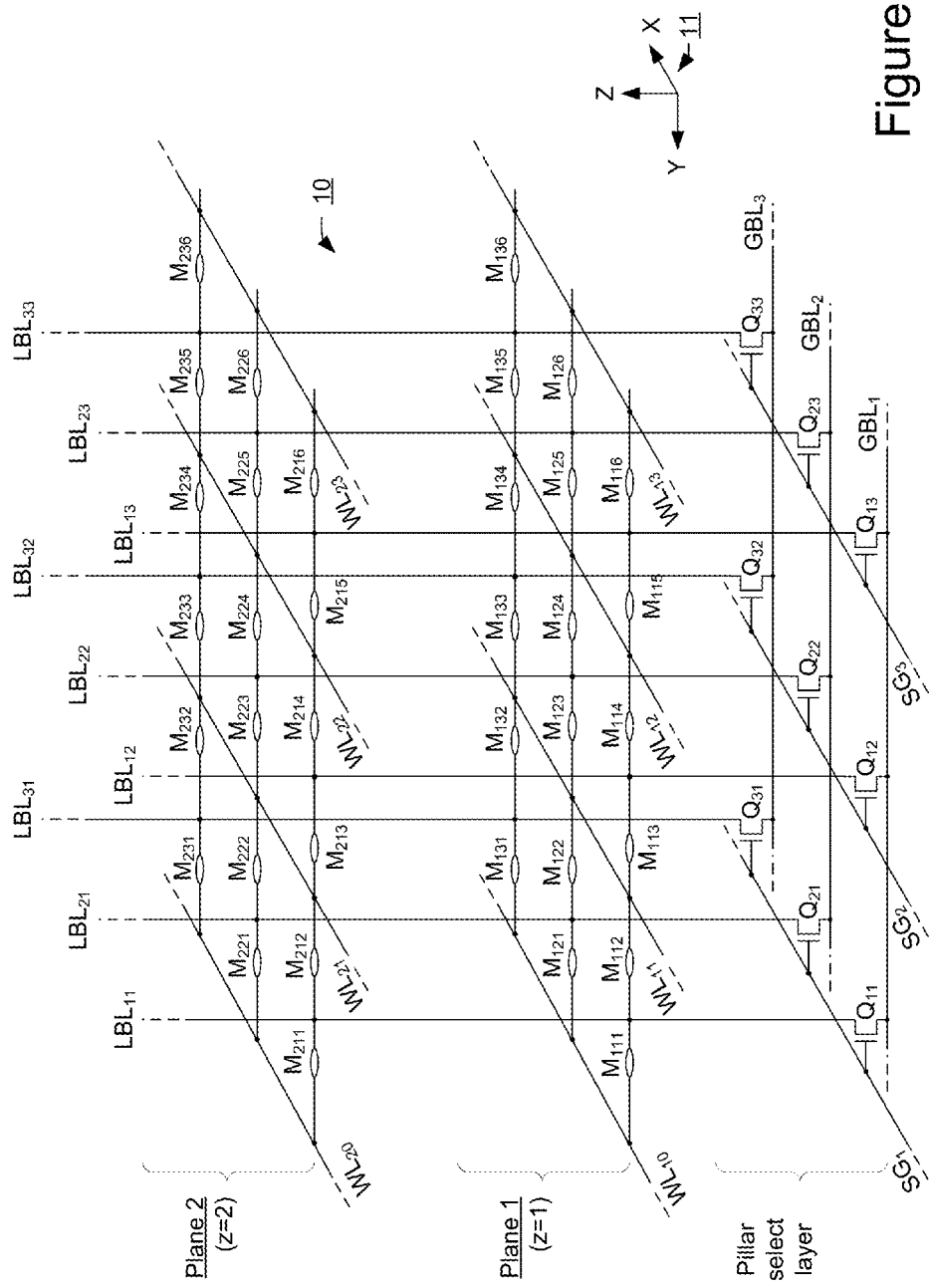
FIG. 1 is an equivalent circuit of a portion of an example three-dimensional array of variable resistance memory elements, wherein the array has vertical bit lines.

The technology described herein is directed to a 3D memory array having a vertically oriented thin film transistor (TFT) selection device. The memory elements may be variable resistance memory elements. In one embodiment, the body of the TFT is formed from a wide band gap semiconductor. Herein, a "wide band gap semiconductor" is defined as any semiconductor that has an energy band gap that is wider than silicon. Silicon may have an energy band gap of about 1.1 eV. Some wide band gap semiconductors may have an energy band gap of about 3 eV or greater. However, the wide band gap semiconductor could have an energy band gap that is less than 3 eV. The wider the energy band gap, the higher the critical field. This means that breakdown voltage may be larger for the same size device, relative to silicon.

In one embodiment, the body (as well as source and drain) of the TFT is formed from an oxide semiconductor. The oxide semiconductor may be a metal oxide semiconductor. As one example, the body could be InGaZnO. Other examples include, but are not limited to, InZnO, HfInZnO, ZrInZnO, and ZnInSnO. Thus, the wide band gap semiconductor for the body may be an oxide semiconductor, a metal oxide semiconductor, etc.

A vertically oriented thin film transistor (TFT) selection device of one embodiment has high drive current, low leakage current, and high breakdown voltage. The transistor height can be made small while still meeting requirements such as the foregoing. The aspect ratio of a hole/trench used to form the transistor can be small while still meeting requirements such as the foregoing. Also, transistor uniformity is good. Moreover, good tradeoffs can be made between the various requirements. For example, breakdown voltage can be made high without unduly sacrificing on current.

Note that requirements such as the foregoing can be difficult to meet with a polysilicon body TFT. This may be due to the effect of polysilicon crystal grains and grain boundaries that increase leakage, reduce breakdown voltage, reduce mobility and drive current, and may also introduce high variability of device parameters.

Memory elements in a 3D memory array may be controlled by applying the proper voltages to their vertical bit lines and word lines. By applying either a select voltage or an unselect voltage to the vertical bit lines, while applying either a select voltage or an unselect voltage to the horizontal word lines, memory cells are selected/unselected for the operation (e.g., SET, RESET, and FORM). The vertically oriented TFT decoder provides the proper voltage to the vertical bit line.

It is important that unselected memory elements remain unselected. Selection of the vertically oriented bit lines themselves is achieved by a vertical TFT have a body formed from a wide band gap semiconductor, in one embodiment. The wide band gap semiconductor for the body may be an oxide semiconductor, a metal oxide semiconductor, etc. Typically, some of the vertical TFTs are turned on to select memory elements, while other vertical TFTs are kept off to keep other memory elements unselected. In this manner the vertical TFTs provide suitable voltages to the vertically oriented bit lines. Word lines are driven with suitable voltages, as well.

One potential problem with the transistor that selects the vertically oriented bit lines is that the transistor may not have a sufficiently high breakdown voltage. If a transistor selection device that is supposed to be off breaks down, then the transistor could apply an unintended voltage to the vertically oriented bit line. Thus, having a high breakdown voltage is an important characteristic. This can be especially important when performing a FORMING operation, although a high breakdown voltage may also benefit SET and RESET operations.

Even if the transistor that is supposed to be off is not in a breakdown regime, but has high leakage current, it can pass an unintended voltage to the vertically oriented bit line. The higher the leakage the faster the unintended voltage can pass to the bit line (the faster the vertical bit line can be charged up).

The transistor leakage can have several components, such as source-drain leakage and leakage related to carrier generation due to high electric field, such as band-to-band generation, trap-assisted generation, etc. All components of the leakage will represent transistor current in the off state—Ioff. For instance, when the gate to drain potential difference is high enough, band-to-band generation may occur, resulting in increased leakage. This is sometimes is referred to as GIDL—gate induced drain leakage.

High gate to drain potential difference also results in high electric field component in the direction perpendicular to the gate dielectric (perpendicular to the direction of channel) contributing to overall electric field increase. The total electric field at the gate/drain edge is then determined by the lateral, or along the channel, field component (dependent on source to drain bias) and the perpendicular to the channel component of the field. When total field is high enough (i.e., voltages high enough), this can trigger impact ionization-generation and breakdown.

If the applied voltage (e.g., drain to source potential difference) is approaching breakdown voltage, the leakage rapidly increases. Therefore if transistor breakdown voltage is increased, the leakage is lower for the same applied voltage(s). Therefore it is important to be able to increase the voltage at which breakdown occurs.

Also it is important to reduce GIDL, which is dependent on gate to drain potential difference.

Sometimes, $I_{off}$ current can be reduced by making a transistor bigger, e.g., increasing transistor channel length. However, this may result in lower drive current ($I_{on}$). For vertical bit line applications it is important for the TFT to deliver high enough $I_{on}$ because the ReRAM memory cell often requires high enough current to switch from SET to RESET and/or vice versa. High $I_{on}$ may also be required for FORMING operation.

Another problem of bigger channel length is the transistor may become bigger. By bigger in the context of a vertically oriented selected device, this means that the TFT is higher. In other words, the aspect ratio (height over body thickness ratio) will increase, which could make it more difficult to fabricate the TFT.

Therefore, it is important to be able to optimize transistor parameters for the best combination or trade-offs for $I_{on}$, $I_{off}$/leakage and breakdown voltage in order to allow efficient operation of the selector device. Also, the smaller the channel length (in this context the vertical size of the transistor), the better it is from process point of view (lower aspect ratio).

In one embodiment, the vertical TFT having a wide energy band gap semiconductor body is used as a bit line selection device in a three-dimensional array of memory elements wherein bit lines of the array are oriented vertically. That is, instead of merely stacking a plurality of two-dimensional arrays on a common semiconductor substrate, where each two-dimensional array has its own bit lines, multiple two-dimensional arrays are stacked on top of each other in separate planes but then share common bit lines that extend up through the planes.

The memory elements used in the three-dimensional array are variable resistive memory elements, in one embodiment. That is, the resistance (and thus inversely the conductance) of the individual memory elements is typically changed as a result of a voltage placed across the orthogonally intersecting conductors to which the memory element is connected. Depending on the type of variable resistive element, the state may change in response to a voltage across it, a level of current through it, an amount of electric field across it, a level of heat applied to it, and the like. With some variable resistive element material, it is the amount of time that the voltage, current, electric field, heat and/or the like is applied to the element that determines when its conductive state changes and the direction in which the change takes place. In between such state changing operations, the resistance of the memory element remains unchanged, so is non-volatile. The three-dimensional array architecture summarized above may be implemented with a memory element material selected from a wide variety of such materials having different properties and operating characteristics.

The resistance of the memory element, and thus its detectable storage state, can be repetitively set from an initial level to another level and then re-set back to the initial level. For some materials, the amount or duration of the voltage, current, electric field, heat and the like applied to change its state in one direction is different (asymmetrical) with that applied to change in another direction. With two detectable states, each memory element stores one-bit of data. With the use of some materials, more than one bit of data may be stored in each memory element by designating more than two stable levels of resistance as detectable states of the memory element. The three-dimensional array architecture herein is quite versatile in the way it may be operated.

This three-dimensional architecture also allows limiting the extent and number of unaddressed (non-selected) resistive memory elements across which an undesired level of voltage is applied during reading and programming operations conducted on other addressed (selected) memory elements. The risk of disturbing the states of unaddressed memory elements and the levels of leakage current passing through unaddressed elements may be significantly reduced from those experienced in other arrays using the same memory element material. Leakage currents are undesirable because they can alter the apparent currents being read from addressed memory elements, thereby making it difficult to accurately read the states of addressed (selected) memory elements. Leakage currents are also undesirable because they add to the overall power draw by an array and therefore undesirably causes the power supply to have to be made larger than is desirable. Because of the relatively small extent of unaddressed memory elements that have voltages applied during programming and reading of addressed memory elements, the array with the three-dimensional architecture herein may be made to include a much larger number of addressed memory elements without introducing errors in reading and exceeding reasonable power supply capabilities. A vertical TFT having a wide energy band gap semiconductor body, in accordance with one embodiment, that selects vertical bit lines has a low leakage current.

In addition, the three-dimensional architecture herein allows variable resistance memory elements to be connected at orthogonal crossings of bit and word line conductors without the need for diodes or other non-linear elements being connected in series with the variable resistive elements. In some 3D arrays of variable resistance memory elements, a diode is connected in series with each memory element in order to reduce the leakage current though the element when it is unselected but nevertheless has a voltage difference placed across it, such as can occur when the unselected memory element is connected to a bit or word line carrying voltages to selected memory elements connected to those same lines. The absence of the need for diodes significantly reduces the complexity of the array and thus the number of processing steps required to manufacture it. The term "connected" refers to direct and indirect connections.

Indeed, the manufacture of the three-dimensional array of memory elements herein is much simpler than other three-dimensional arrays using the same type of memory elements. In particular, a fewer number of masks is required to form the elements of each plane of the array. The total number of processing steps needed to form integrated circuits with the three-dimensional array are thus reduced, as is the cost of the resulting integrated circuit.

Referring initially to FIG. 1, an architecture of one embodiment of a three-dimensional memory 10 is schematically and generally illustrated in the form of an equivalent circuit of a portion of such a memory. A standard three-dimensional rectangular coordinate system 11 is used for reference, the directions of each of vectors x, y and z being orthogonal with the other two. In another embodiment direction x and x are substantially 60 degrees from each other.

A circuit for selectively connecting internal memory elements with external data circuits is preferably formed using select devices $Q_{xy}$, where x gives a relative position of the device in the x-direction and y its relative position in the y-direction. The individual select devices $Q_{xy}$ are vertical TFTs having a channel extension, in accordance with embodiments. Global bit lines ($GBL_x$) are elongated in the y-direction and have relative positions in the x-direction that are indicated by the subscript. The global bit lines ($GBL_x$) are individually connectable with the source or drain of the vertical TFT select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of vertical TFT select devices $Q_{xy}$ having a common position in the y-direction. In one embodiment, the TFT select devices have a wide energy band gap semiconductor body. The source and drain may also be formed from the wide energy band gap semiconductor. The wide energy band gap semiconductor may be an oxide semiconductor, a metal oxide semiconductor, etc.

The vertical TFT select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the vertical TFT select devices to which it is connected. The remaining row select lines receive voltages that keep their connected vertical TFT select devices $Q_{xy}$ off. It may be noted that since only one vertical TFT select device ($Q_{xy}$) is used with each of the local bit lines ($LBL_{xy}$), the pitch of the array across the semiconductor substrate in both x and y-directions may be made very small, and thus the density of the memory storage elements large.

The vertical TFT select devices $Q_{xy}$ have channel extensions (otherwise referred to as gate/junction offsets). The channel extension improves performance characteristic, such as breakdown voltage and Gate Induced Drain Leakage (GIDL). This helps to keep the vertical TFT select device off, when it should be off. It also helps keep leakage current low.

Memory elements $M_{zxy}$ are formed in a plurality of planes positioned at different distances in the z-direction above a substrate (which may be below the pillar select layer). Two planes 1 and 2 are illustrated in FIG. 1 but there will typically be more, such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. After the device is first fabricated, voltages may be selected to provide the electrical stimulus necessary to "FORM" the memory element, which refers to lowering its resistance from a virgin state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

The memory arrays described herein, including memory 10, may be monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Figure 2:
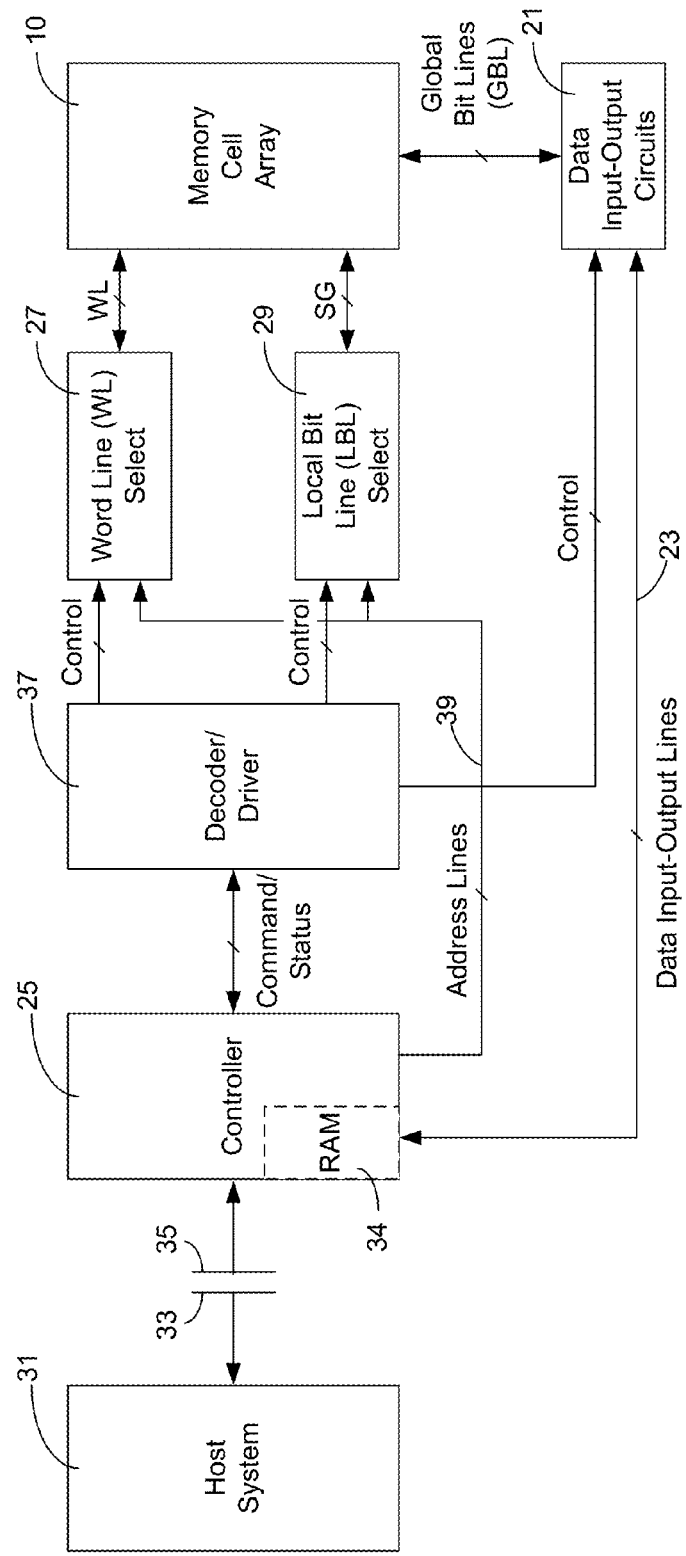
FIG. 2 is a schematic block diagram of a re-programmable non-volatile memory system which utilizes the memory array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed memory elements $M_{zxy}$. Data input-output circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the local bit line select circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although each of the memory elements $M_{zxy}$ in the array of FIG. 1 may be individually addressed for changing its state according to incoming data or for reading its existing storage state, it may be preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is may be preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to flash memory arrays. Resetting a block of memory elements to a common state corresponds to erasing a block of flash memory elements to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
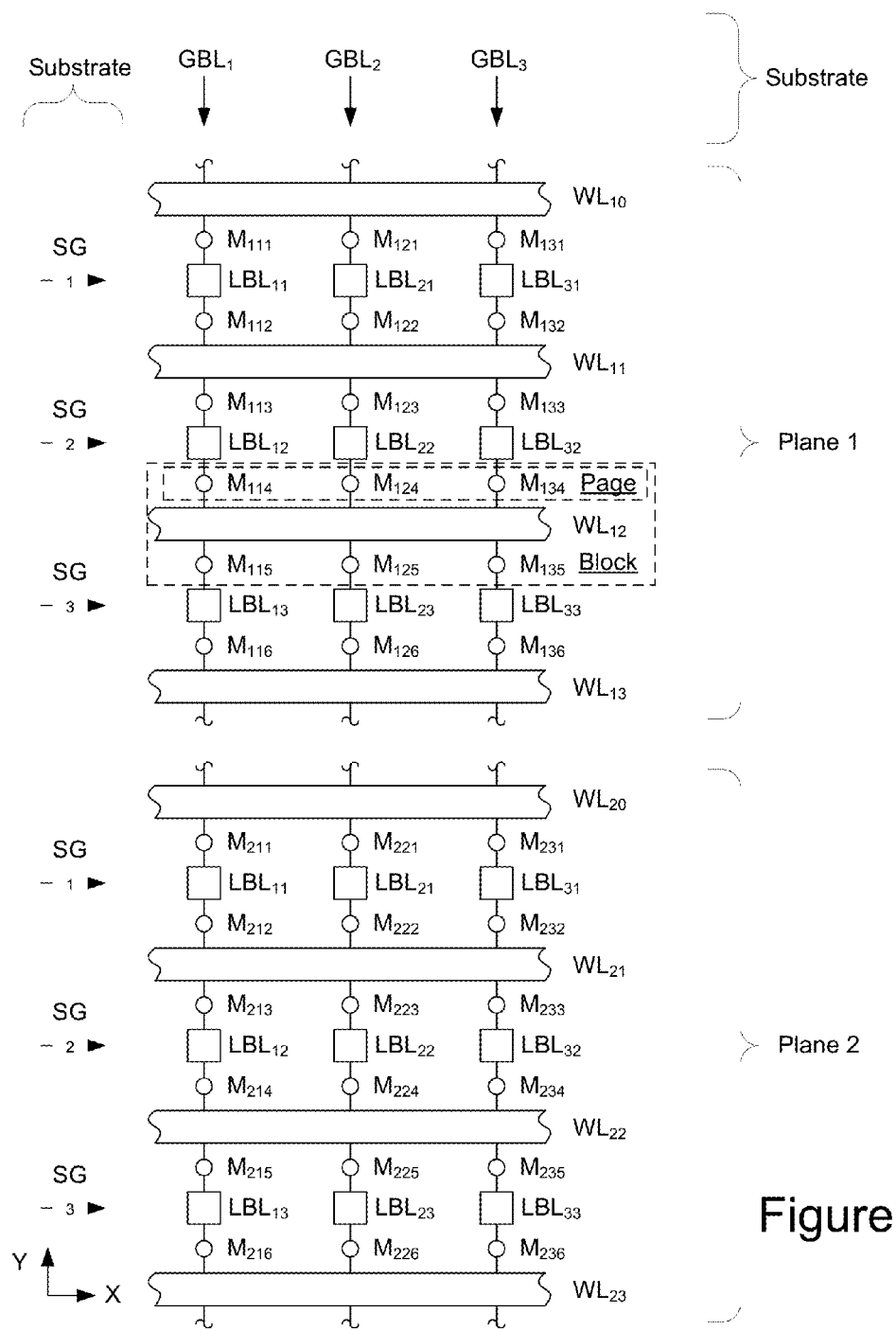
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

Example resetting, programming (e.g., setting) and reading operations of the memory array of FIGS. 1 and 3, when operated as array 10 in the memory system of FIG. 2, will now be described. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1," depending upon the memory element state.

To reset (e.g., erase) a block of memory elements, the memory elements in that block are placed into their high resistance state. This state will be designated as the logical data state "1," following the convention used in current flash memory arrays but it could alternatively be designated to be a "0." As shown by the example in FIG. 3, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 3 as an example:

1. Set all of the global bit lines ($GBL_1$, $GBL_2$ and $GBL_3$ in the array of FIGS. 1 and 3) to zero volts, by the circuits 21 of FIG. 2.
2. Set at least the two row select lines on either side of the one word line of the block to H' volts, so that the local bit lines on each side of the word line in the y-direction are connected to their respective global bit lines through their select devices and therefore brought to zero volts. The voltage H' is made high enough to turn on the vertical TFT select devices $Q_{xy}$, for example, something in a range of 1-6 volts, typically 3 volts. The block shown in FIG. 3 includes the word line $WL_{12}$, so the row select lines $SG_2$ and $SG_3$ (FIG. 1) on either side of that word line are set to H' volts, by the circuits 29 of FIG. 2, in order to turn on the vertical TFT select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines $GBL1$, $GBL2$ and $GBL3$. Two of the local bit lines adjacent to each other in the y-direction are connected to a single global bit line. Those local bit lines are then set to the zero volts of the global bit lines. The remaining local bit lines preferably remain unconnected and with their voltages floating.

3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1 and 3, word line $WL_{12}$ is placed at H volts, while all other word lines in the array are placed at zero volts, all by the circuits 27 of FIG. 2.

The result is that H volts are placed across each of the memory elements of the block. In the example block of FIG. 3, this includes the memory elements $M_{114}$, $M_{124}$, $M_{134}$, $M_{115}$, $M_{125}$ and $M_{135}$. For the type of memory material being used as an example, the resulting currents through these memory elements places any of them not already in a high resistance state, into that re-set state.

It may be noted that no stray currents will flow because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required. In some embodiments, less than all memory elements of a block will be simultaneously reset.

The memory elements of a page are preferably programmed concurrently, in order to increase the parallelism of the memory system operation. An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1." For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 4:
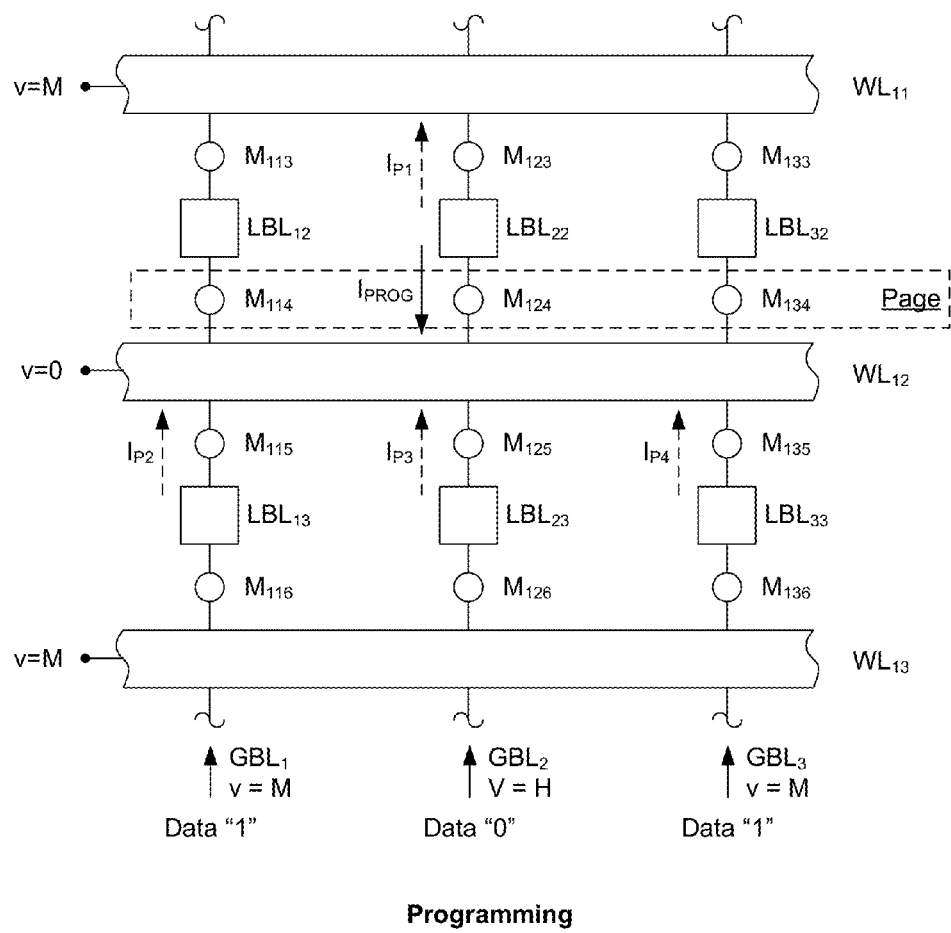
FIG. 4 is an expanded view of a portion of one of the planes of FIG. 3, annotated to show effects of programming data therein.

Referring to FIGS. 3 and 4, an example programming operation within the indicated one page of memory elements $M_{114}$, $M_{124}$ and $M_{134}$ is described, as follows:

1. The voltages placed on the global bit lines are in accordance with the pattern of data received by the memory system for programming. In the example of FIG. 4, $GBL_1$ carries logical data bit "1", $GBL_2$ the logical bit "0" and $GBL_3$ the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.

2. Set the word line of the page being programmed to 0 volts, in this case selected word line $WL_{12}$. This is the only word line to which the memory elements of the page are connected. Each of the other word lines on all planes is set to the M level. These word line voltages are applied by the circuits 27 of FIG. 2.

3. Set one of the row select lines below and on either side of the selected word line to the H' voltage level, in order to select a page for programming. For the page indicated in FIGS. 3 and 4, the H' voltage is placed on row select line $SG_2$ in order to turn on select devices $Q_{12}$, $Q_{22}$ and $Q_{32}$ (FIG. 1). All other row select lines, namely lines $SG_1$ and $SG_3$ in this example, are set to 0 volts in order to keep their select devices off. The row select line voltages are applied by the circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current $I_{PROG}$ is sent through the memory element $M_{124}$, thereby causing that memory element to change from a reset state to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected row select line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

There are typically parasitic currents present during the programming operation that can increase the currents that must be supplied through the selected word line and global bit lines. During programming there are two sources of parasitic currents, one to the adjacent page in a different block and another to the adjacent page in the same block. An example of the first is the parasitic current $I_{P1}$ shown on FIG. 4 from the local bit line $LBL_{22}$ that has been raised to the voltage level H during programming. The memory element $M_{123}$ is connected between that voltage and the voltage level M on its word line $WL_{11}$. This voltage difference can cause the parasitic current $-I_{P1}$ to flow. Since there is no such voltage difference between the local bit lines $LBL_{12}$ or $LBL_{32}$ and the word line $WL_{11}$, no such parasitic current flows through either of the memory elements $M_{113}$ or $M_{133}$, a result of these memory elements remaining in the reset state according to the data being programmed.

Other parasitic currents can similarly flow from the same local bit line $LBL_{22}$ to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-16 planes may generally be used in most cases, but a different amount can also be used.

The other source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents $I_{P2}$, $I_{P3}$ and $I_{P4}$ shown in FIG. 4. In general, these currents will be much less than the other parasitic current $I_{P1}$ discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed. An example of this technique is described in U.S. Pat. No. 5,172,338.

Figure 5:
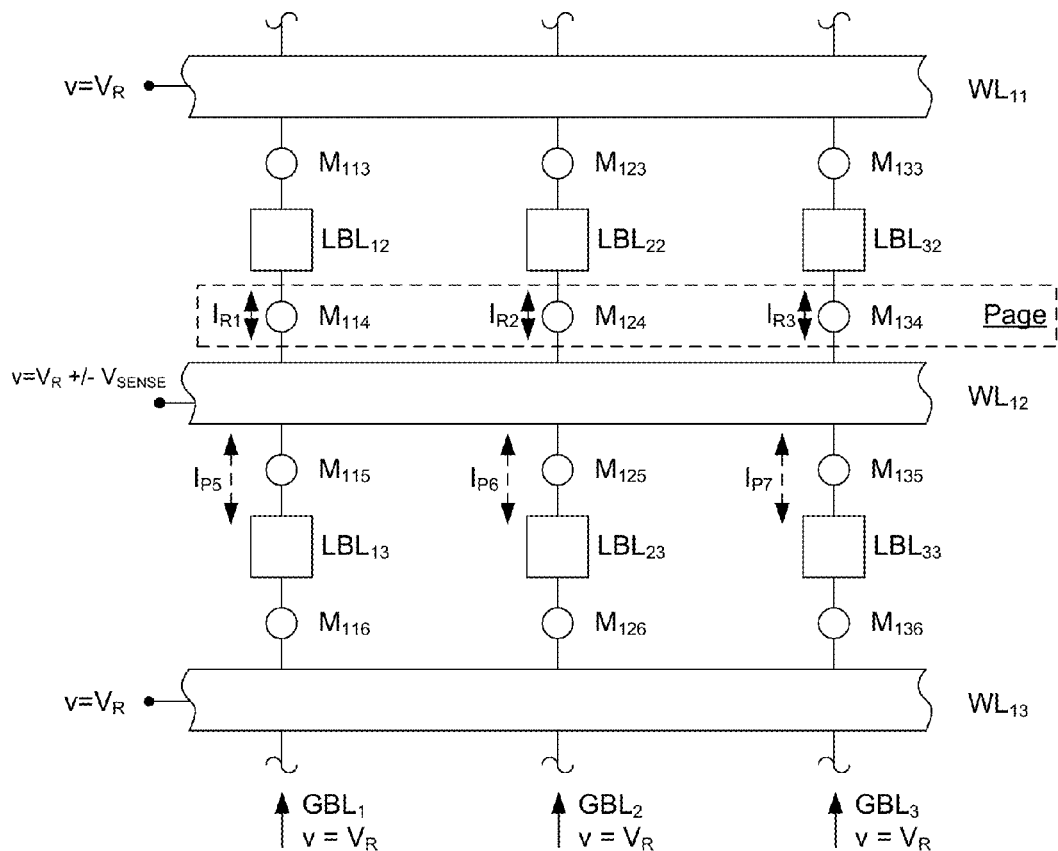
FIG. 5 is an expanded view of a portion of one of the planes of FIG. 3, annotated to show effects of reading data therefrom.

With reference primarily to FIG. 5, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.
2. Turn on one row of select devices by placing a voltage on the control line adjacent to the selected word line in order to define the page to be read. In the example of FIGS. 1 and 5, a voltage is applied to the row select line $SG_2$ in order to turn on the vertical TFT select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the circuits 21 of FIG. 2, and assume the potential $V_R$ of the global bit lines to which they are connected. All other local bit lines LBLs are allowed to float.
3. Set the selected word line ($WL_{12}$) to a voltage of $V_R \pm V\text{sense}$. The sign of Vsense is chosen based on the sense amplifier and has a magnitude of about 0.5 volt. The voltages on all other word lines remain the same.
4. Sense current flowing into ($V_R + V\text{sense}$) or out of ($V_R - V\text{sense}$) each sense amplifier for time T. These are the currents $I_{R1}$, $I_{R2}$ and $I_{R3}$ shown to be flowing through the addressed memory elements of the example of FIG. 5, which are proportional to the programmed states of the respective memory elements $M_{114}$, $M_{124}$ and $M_{134}$. The states of the memory elements $M_{114}$, $M_{124}$ and $M_{134}$ are then given by binary outputs of the sense amplifiers within the circuits 21 that are connected to the respective global bit lines $GBL_1$, $GBL_2$ and GBL$_3$. These sense amplifier outputs are then sent over the lines 23 (FIG. 2) to the controller 25, which then provides the read data to the host 31.

5. Turn off the vertical TFT select devices (Q$_{12}$, Q$_{22}$ and Q$_{32}$) by removing the voltage from the row select line (SG$_2$), in order to disconnect the local bit lines from the global bit lines, and return the selected word line (WL$_{12}$) to the voltage V$_R$.

Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

As in the programming case, all of the local bit lines except the selected row (LBL$_{12}$, LBL$_{22}$ and LBL$_{32}$ in the example of FIG. 5) are floating. But the potential of the floating local bit lines may be driven to V$_R$ by any memory element that is in its programmed (low resistance) state and connected between a floating local bit line and a word line at V$_R$, in any plane. A parasitic current comparable to I$_{P1}$ in the programming case (FIG. 4) is not present during data read because both the selected local bit lines and the adjacent non-selected word lines are both at V$_R$. Parasitic currents may flow, however, through low resistance memory elements connected between floating local bit lines and the selected word line. These are comparable to the currents I$_{P2}$, I$_{P3}$, and I$_{P4}$ during programming (FIG. 4), indicated as I$_{P5}$, I$_{P6}$ and I$_{P7}$ in FIG. 5. Each of these currents can be equal in magnitude to the maximum read current through an addressed memory element. However, these parasitic currents are flowing from the word lines at the voltage V$_R$ to the selected word line at a voltage V$_R$±Vsense without flowing through the sense amplifiers. These parasitic currents will not flow through the selected local bit lines (LBL$_{12}$, LBL$_{22}$ and LBL$_{32}$ in FIG. 5) to which the sense amplifiers are connected. Although they contribute to power dissipation, these parasitic currents do not therefore introduce a sensing error.

Although the neighboring word lines should be at V$_R$ to minimize parasitic currents, as in the programming case it may be desirable to weakly drive these word lines or even allow them to float. In one variation, the selected word line and the neighboring word lines can be pre-charged to V$_R$ and then allowed to float. When the sense amplifier is energized, it may charge them to V$_R$ so that the potential on these lines is accurately set by the reference voltage from the sense amplifier (as opposed to the reference voltage from the word line driver). This can occur before the selected word line is changed to V$_R$±Vsense but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin. Further information regarding the use of reference cells within a page can be found in U.S. Pat. Nos. 6,222,762, 6,538,922, 6,678,192 and 7,237,074.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two-step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers. An example of this is shown in U.S. Pat. No. 7,324,393.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Because of the reduced number of parasitic currents in the three-dimensional array herein, the total magnitude of parasitic currents can be managed without the use of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. An advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials. For these reasons, the embodiments discussed below utilize memory elements that include resistance switching material and do not include a diode or other separate steering device. The use of memory elements that have a non-linear current versus voltage relationship are also envisioned. For example as the voltage across an HfOx memory element is reduced from the programming voltage to one half the programming voltage the current is reduced by a factor of 5 or even more. In such an embodiment the total magnitude of parasitic currents can be managed without the use of diodes in the array.

The level of parasitic currents increases with the number of planes and with the number of memory elements connected along the individual word lines within each plane. The increase in parasitic currents increases only slightly with additional planes because the selected word line is on only one plane such as WL12 in FIG. 4. Parasitic currents Ip1, Ip2, Ip3, and Ip4 are all on the plane that contains WL12. Leakage currents on other planes are less significant because the floating lines tend to minimize currents on elements not directly connected to the selected word line. Also since the number of unselected word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory array being described herein has many advantages. The quantity of digital data that may be stored per unit of semiconductor substrate area is high. It may be manufactured with a lower cost per stored bit of data. Only a few masks are necessary for the entire stack of planes, rather than requiring a separate set of masks for each plane. The number of local bit line connections with the substrate is significantly reduced over other multi-plane structures that do not use the vertical local bit lines. The architecture eliminates the need for each memory element to have a diode in series with the resistive memory element, thereby further simplifying the manufacturing process and enabling the use of metal conductive lines. Also, the voltages necessary to operate the array are much lower than those used in current commercial flash memories.

Since at least one-half of each current path is vertical, the voltage drops present in large cross-point arrays are significantly reduced. The reduced length of the current path due to the shorter vertical component means that there are approximately one-half the number memory elements on each current path and thus the leakage currents are reduced as is the number of unselected memory elements disturbed during a data programming or read operation. For example, if there are N cells associated with a word line and N cells associated with a bit line of equal length in a conventional array, there are 2N cells associated or "touched" with every data operation. In the vertical local bit line architecture described herein, there are n cells associated with the bit line (n is the number of planes and is typically a small number such as 4 to 16), or N+n cells are associated with a data operation. For a large N this means that the number of cells affected by a data operation is approximately one-half as many as in a conventional three-dimensional array.

Materials Useful for the Memory Storage Elements

The material used for the non-volatile memory elements $M_{zxy}$ in the array of FIG. 1 can be a chalcogenide, a metal oxide, CMO, or any one of a number of materials that exhibit a stable, reversible shift in resistance in response to an external voltage applied to or current passed through the material.

Metal oxides are characterized by being insulating when initially deposited. One suitable metal oxide is a titanium oxide ($TiO_x$) in which near-stoichiometric $TiO_2$ bulk material is altered in an annealing process to create an oxygen deficient layer (or a layer with oxygen vacancies) in proximity of the bottom electrode. The top platinum electrode for memory storage element comprising $TiO_x$, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^+_2$) and behaves as a low resistance contact (ohmic contact). (The oxygen vacancies in $TiO_2$ are known to act as n–type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile memory elements $M_{zxy}$ in the array of FIG. 1 include HfOx, ZrOx, WOx, NiOx, CoOx, CoAlOx, MnOx, $ZnMn_2O_4$, ZnOx, TaOx, NbOx, HfSiOx, HfAlOx. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich TiOx, TiAlN, TaAlN, TiSiN, TaSiN, $IrO_2$ and doped polysilicon. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 2 nm to 20 nm.

One example non-volatile memory element uses Hafnium Oxide (e.g., $HfO_2$) as a reversible resistance-switching material, and positions the reversible resistance-switching material between two electrodes. A first electrode is positioned between reversible resistance-switching material and a first conductor (e.g. bit line or word line). In one embodiment, the first electrode is made of platinum. The second electrode is positioned between reversible resistance-switching material a second conductor (e.g., bit line or word line). In one embodiment, the second electrode is made of Titanium Nitride, and serves as a barrier layer. In another embodiment, the second electrode is n+ doped polysilicon and the first electrode is Titanium Nitride. Other materials can also be used. The technologies described below are not restricted to any one set of materials for forming the non-volatile memory elements.

In another embodiment, the memory storage element will include Hafnium Oxide (or different metal oxide or different material) as the reversible resistance-switching material, without any electrodes being positioned between the reversible resistance-switching material and the conductors (e.g., bit lines and/or word lines).

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates, are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into an $sp^3$ form ("reset" state). It has been theorized that the high local temperatures generated by this pulse causes disorder in the material and if the pulse is very short, the carbon "quenches" in an amorphous state ($sp^3$ hybridization). On the other hand, when in the reset state, applying a lower voltage for a longer time (~300 nsec) causes part of the material to change into the $sp^2$ form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a p-n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to low resistance, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

For simplicity the above description has considered the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC). The principles of such operation are described in U.S. Pat. No. 5,172,338 referenced earlier. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, Jun. 12-17, 2005, pp. 48-53 and "Time Discrete Voltage Sensing and Iterative Programming Control for a 4F2 Multilevel CBRAM" by Schrogmeier et al. (2007 Symposium on VLSI Circuits).

Structural Example of the Three-Dimensional Array

Figure 6:
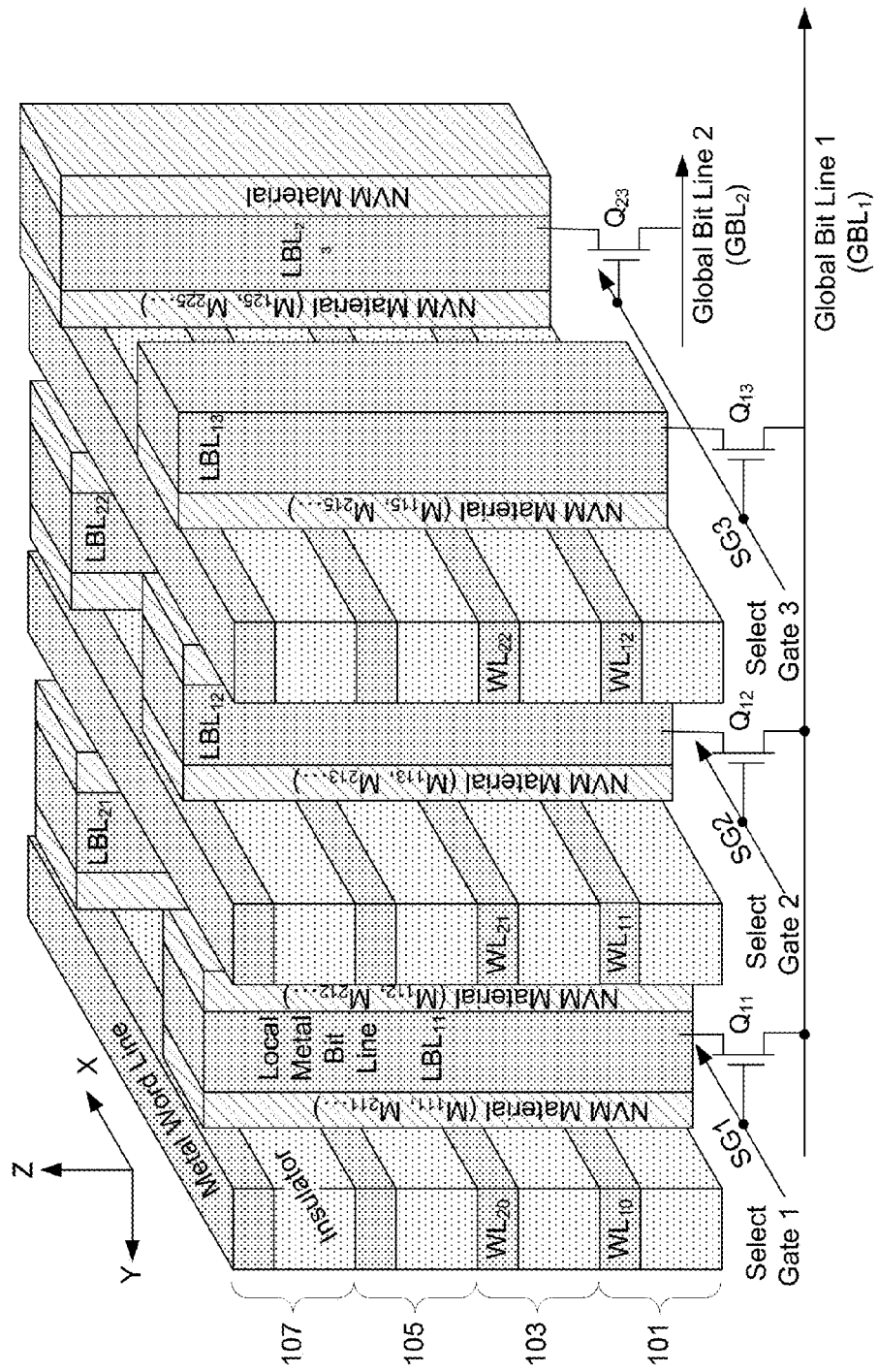
FIG. 6 is an isometric view of a portion of the three-dimensional array shown in FIG. 1 according to a first specific example of an implementation thereof.

One example semiconductor structure for implementing the three-dimensional memory element array of FIG. 1 is illustrated in FIG. 6, which is configured for use of non-volatile memory element (NVM) material that is non-conductive when first deposited. A metal oxide of the type discussed above has this characteristic. Since the material is initially non-conductive, there is no necessity to isolate the memory elements at the cross-points of the word and bit lines from each other. Several memory elements may be implemented by a single continuous layer of material, which in the case of FIG. 6 are strips of NVM material oriented vertically along opposite sides of the vertical bit lines in the y-direction and extending upwards through all the planes. A significant advantage of the structure of FIG. 6 is that all word lines and strips of insulation under them in a group of planes may be defined simultaneously by use of a single mask, thus greatly simplifying the manufacturing process.

Referring to FIG. 6, a small part of four planes 101, 103, 105 and 107 of the three-dimensional array are shown. Elements of the FIG. 6 array that correspond to those of the equivalent circuit of FIG. 1 are identified by the same reference numbers. It will be noted that FIG. 6 shows the two planes 1 and 2 of FIG. 1 plus two additional planes on top of them. All of the planes have the same horizontal pattern of conductor, dielectric and NVM material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) running in the y-direction at the same pitch as the pillar spacing through the vertical TFT select devices ($Q_{xy}$) whose gates are driven by the row select lines (SG) elongated in the x-direction. The vertical TFT select devices have a channel extension, in one embodiment. The body of the TFT select devices are formed from a wide band gap semiconductor, in one embodiment. The wide band gap semiconductor for the body may be an oxide semiconductor, a metal oxide semiconductor, etc.

Not shown in FIG. 6 are sense amplifiers, input-output (I/O) circuitry, control circuitry, and any other necessary peripheral circuitry. There is one row select line (SG) for each row of local bit line pillars in the x-direction and one vertical TFT select device (Q) for each individual vertical local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

In one embodiment, the NVM material includes Hafnium Oxide, the word lines comprise TiN, and the bit lines comprise N+ silicon.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

Vertical TFT Decoder Having Wide Energy Band Gap Semiconductor Body

To enable the memory to be denser (e.g., more memory elements per area), the size of the memory elements can be made small and the memory elements can be arranged close to each. To enable the memory elements to be close to each other, one embodiment uses a vertically oriented TFT decoder for connecting the individual local vertical bit line pillars to the respective global bit lines. In one embodiment, each vertically oriented TFT select device is a pillar select device that is formed as a vertical structure, switching between a local bit line pillar and a global bit line. The vertical TFT select devices, are in some embodiments formed in a separate layer (pillar select layer) above the CMOS layer/substrate, along the z-direction between the array of global bit lines and the array of local bit lines. The CMOS layer is the substrate where the support circuitry is implemented, including the row select circuit and word line drivers. The use of vertically oriented TFT select devices above, but not in, the substrate allows the memory elements to be arranged in a more compact fashion, thereby increasing density. Additionally, positioning the vertically oriented TFT select devices above the substrate allows for other devices (e.g., the word line drivers) to be positioned in the substrate under the memory array rather than outside of the array, which allows the integrated circuit to be smaller.

For example, a pillar shaped vertical Thin Film Transistor (TFT) can be can be used as the select device. In one example implementation, a control node of the select transistor has a collar shaped hole, and the gate and channel region are formed in the hole with the source/drain regions formed above/below the channel region. Another alternative is to define the gates as a rail etch and have the channel deposited in a trench between the gates and singulated by an etch with crossing lines mask (rather than holes).

Figure 7:
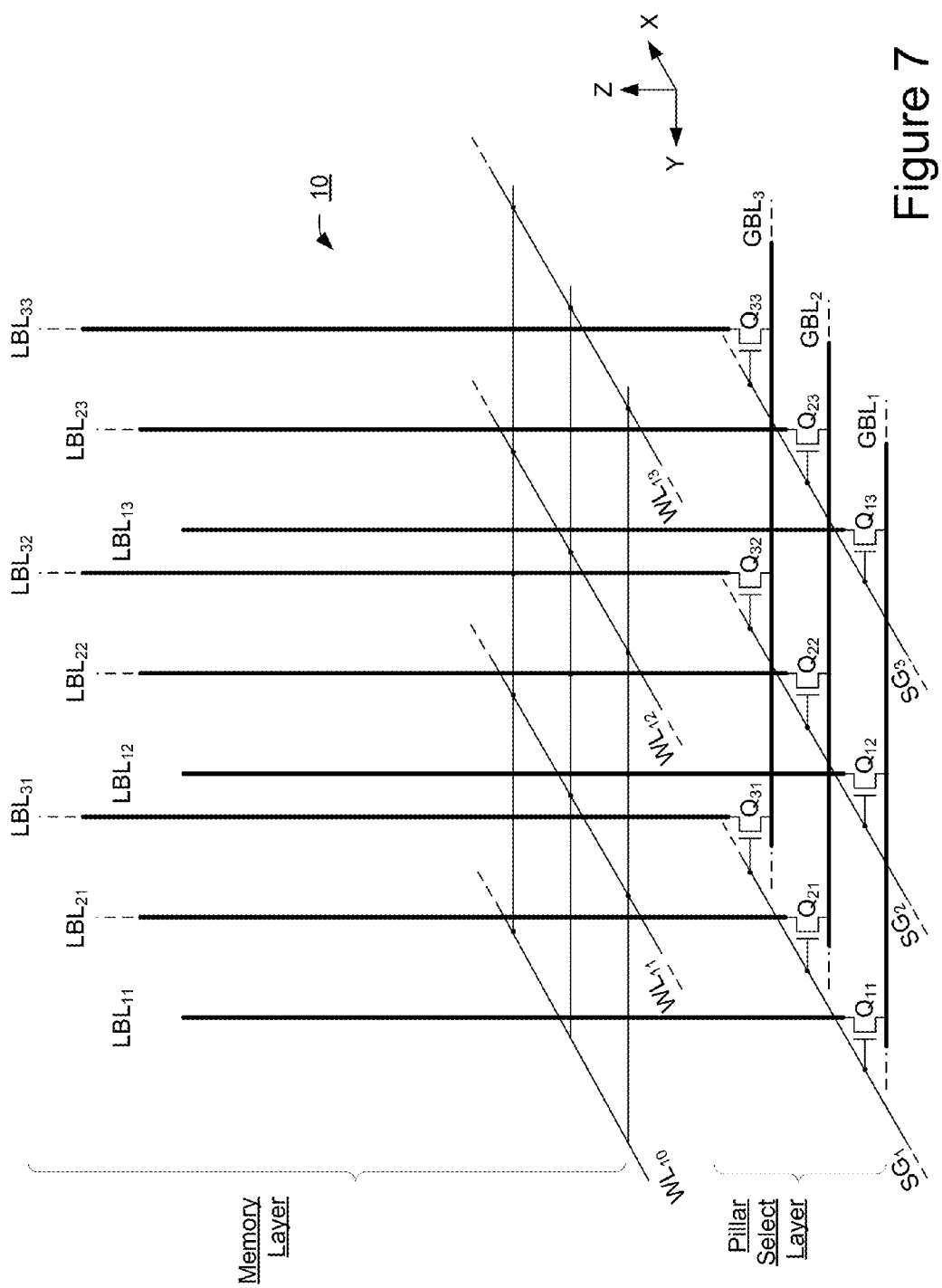
FIG. 7 is an equivalent circuit of a portion of an example three-dimensional array of variable resistance memory elements, wherein the array has vertical bit lines and a pillar select layer, both of which are above (and not in) the substrate.

FIG. 7 illustrates schematically the three dimensional memory ("3D memory") comprising of a memory layer on top of a pillar select layer. The 3D memory 10 is formed on top of a CMOS substrate (not shown explicitly) where structures in the CMOS are referred to as being in the FEOL ("Front End of Lines"). The vertically oriented TFT select devices switching individual vertical bit lines (that are above and not in the substrate) to individual global bit lines are now formed on top of the FEOL layer in the BEOL ("Back End of Lines"). Thus, the BEOL comprises of the pillar select layer with the memory layer on top of it. The vertically oriented TFT select devices (such as $Q_{11}$, $Q_{12}, \ldots, Q_{21}, Q_{22}, \ldots$, etc.) are formed in the pillar select layer as vertically oriented TFT select devices. The pillar select layer is formed above (and not in) the substrate. The memory layer comprises multiple layers of word lines and memory elements. For simplicity, FIG. 7 shows only one layer of word lines, such as $WL_{10}$, $W_{11}$, ..., etc., without showing the memory elements that exist between each crossing of a word line and a bit line.

In the example of FIG. 7, the vertically oriented TFT select devices have one gate that is connected to one of the select lines. In some embodiments, each vertically oriented TFT select device has two gates.

Figure 8B:
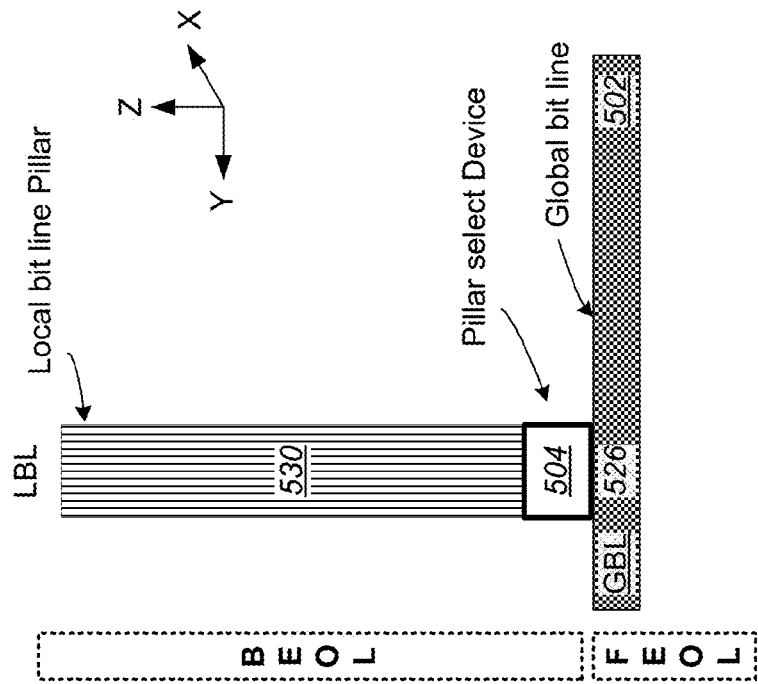
FIG. 8B is a plan view that depicts a vertical bit line, a vertically oriented select device and a global bit line.
Figure 8A:
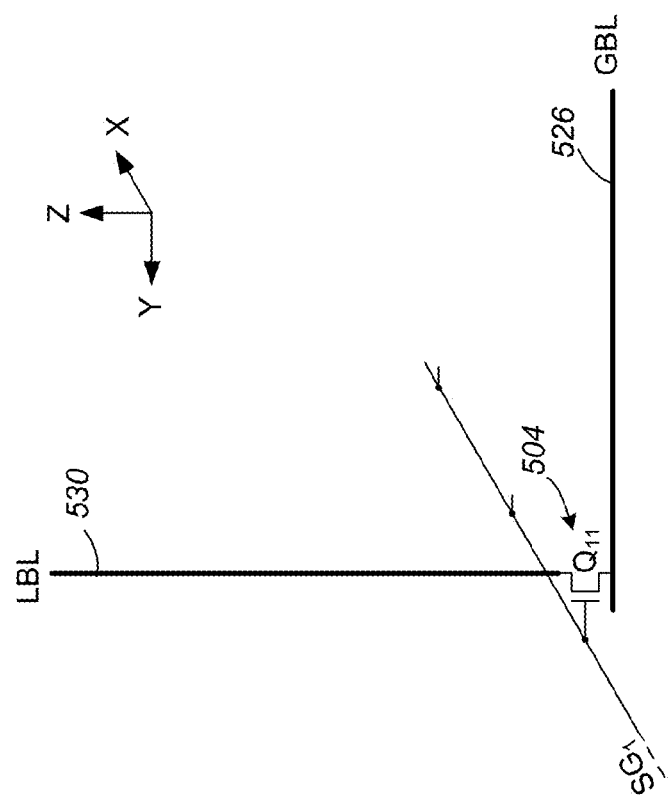
FIG. 8A is a schematic that depicts a vertical bit line, a vertically oriented select device and a global bit line.

FIG. 8A illustrates a schematic circuit diagram of a given vertically oriented TFT select device switching a local bit line to a global bit line. In the example, the local bit line LBL 530 is switchable to the global bit line GBL 526 by a vertically oriented TFT select transistor 504 such as $Q_{11}$. The gate of the TFT select transistor $Q_{11}$ is controllable by a signal exerted on a row select line $SG_1$.

FIG. 8B illustrates the structure of the vertically oriented TFT select device in relation to the local bit line and the global bit line. The global bit line such as GBL 526 is formed below the vertically oriented TFT select device, in the FEOL as part of the metal layer-1 or metal layer-2 502. The vertically oriented TFT select device is formed in the BEOL layer on top of the GBL 526 (and above, but not in, the substrate). The local bit line LBL 530, in the form of a pillar, is formed on top of the vertically oriented select device 504. In this way, the vertically oriented TFT select device 504 can switch the local bit line pillar LBL to the global bit line GBL.

Figure 9:
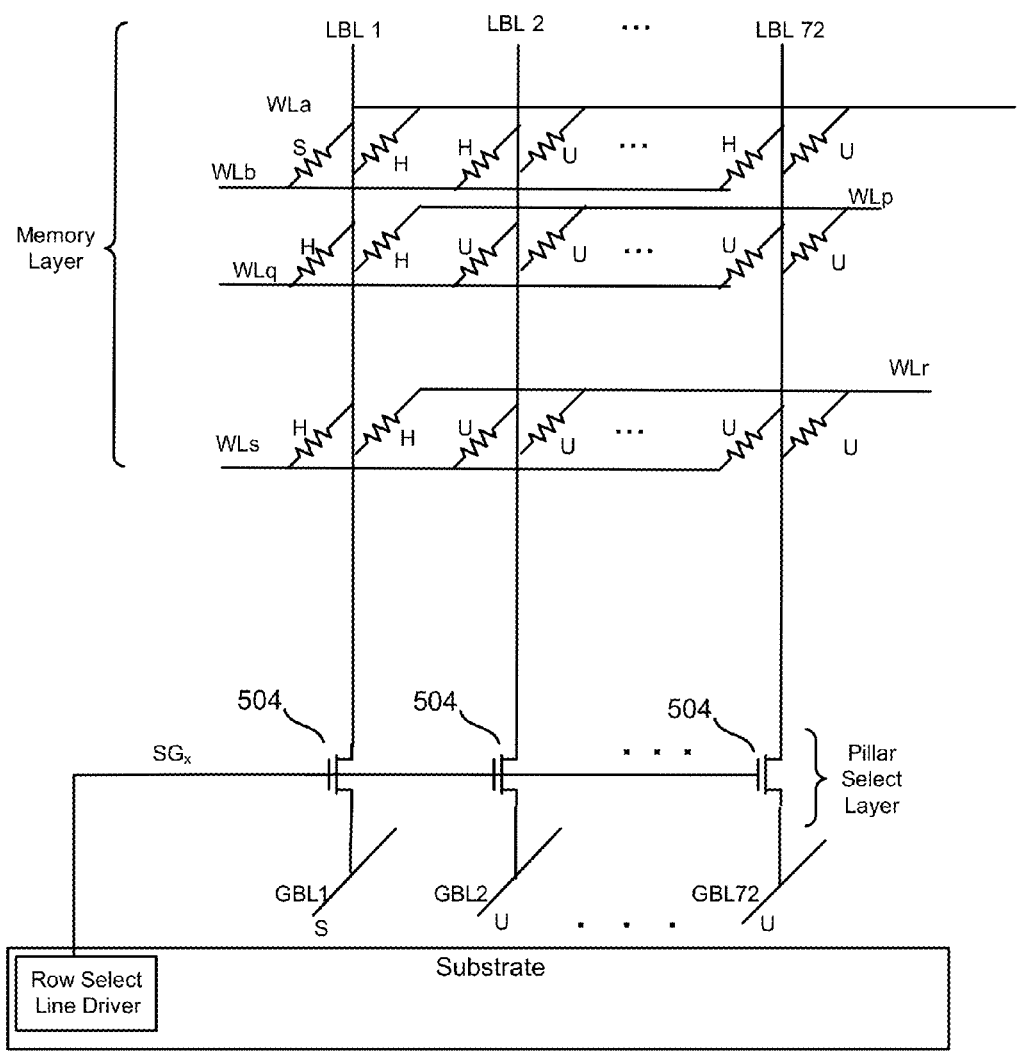
FIG. 9 is a schematic of a portion of the memory system, depicting vertical bit lines above the substrate, vertically oriented select devices above the substrate and row select line drivers in the substrate.

FIG. 9 shows a portion of the memory system, with the memory elements being depicted as resistors (due to their reversible resistance switching properties). FIG. 9 shows the Pillar Select Layer below the Memory Layer and above (and not in) the Substrate. Only a portion of the Memory Layer is illustrated. For example, FIG. 9 shows bit lines LBL1, LBL2, ... LBL72. In this embodiment each of the word lines are connected to 72 memory elements. Each of the memory elements is connected between a word line and a bit line. Therefore, there will be 72 memory elements connected to the same word line and different bit lines (of the 72 bit lines in a row). Each of the bit lines are connected to a respective global bit line by one of the vertically oriented TFT select devices 504 of the Pillar Select Layer. The signal $SG_x$ driving the set of vertically oriented TFT select devices 504 depicted in FIG. 9 is controlled by the Row Select Line Driver. Note that the Row Select Line Driver is implemented in the substrate. The global bit lines (GBL1, GBL2, ... GBL72) are implemented in the metal lines above the substrate. FIG. 9 shows one slice taken along the word line direction such that each of the bit lines depicted in FIG. 9 are connected to different global bit lines via the vertically oriented TFT select devices 504.

In one embodiment, pairs of neighboring word lines (e.g., WLa and WLb, WLp and WLq, WLr and WLs) will be connected to memory elements that are in turn connected to common bit lines. FIG. 9 shows three pairs of word lines (WLa and WLb, WLp and WLq, WLr and WLs), with each of the pair being on a different layer of the memory structure. In one illustrative embodiment, the word lines receive address dependent signals such a that word line WLb is selected for memory operation while word lines WLa, WLp, WLq, WLr and WLs are not selected. Although the enabling signal applied on row select line SGx causes all of the vertically oriented TFT select devices 504 to connect the respective global bit lines to the respective local bit lines of FIG. 9, only the global bit line GLBL1 includes a data value for programming (as noted by the S). Global bit lines GLBL2 and GLBL72 do not include data for programming (as noted by the U). This can be due to the data pattern being stored as the global bit lines receive data dependent signals. Note that while SGx receive an enable signal, other select lines receive a disable signal to turn off the connected select devices.

Because local bit line LBL 1 and word line WLb are both selected for programming, the memory element between local bit line LBL1 and word line WLb is selected for the memory operation (as noted by the S). Since local bit line LBL1 is the only bit line with program data, the other memory elements connected to WLb will be half selected (as noted by H). By half selected, it is meant that one of the control lines (either the bit line or the word line) is selected but the other control line is not selected. A half selected memory element will not undergo the memory operation. The word line WLa is not selected; therefore, the memory cell between WLa and local bit line LBL1 is half selected, and the other memory elements on WLa are unselected. Since word lines WLp, WLq, WLr and WLs are not selected, their memory elements connected to LBL1 are half selected and the other memory elements connected to those word lines are unselected.

Figure 10:
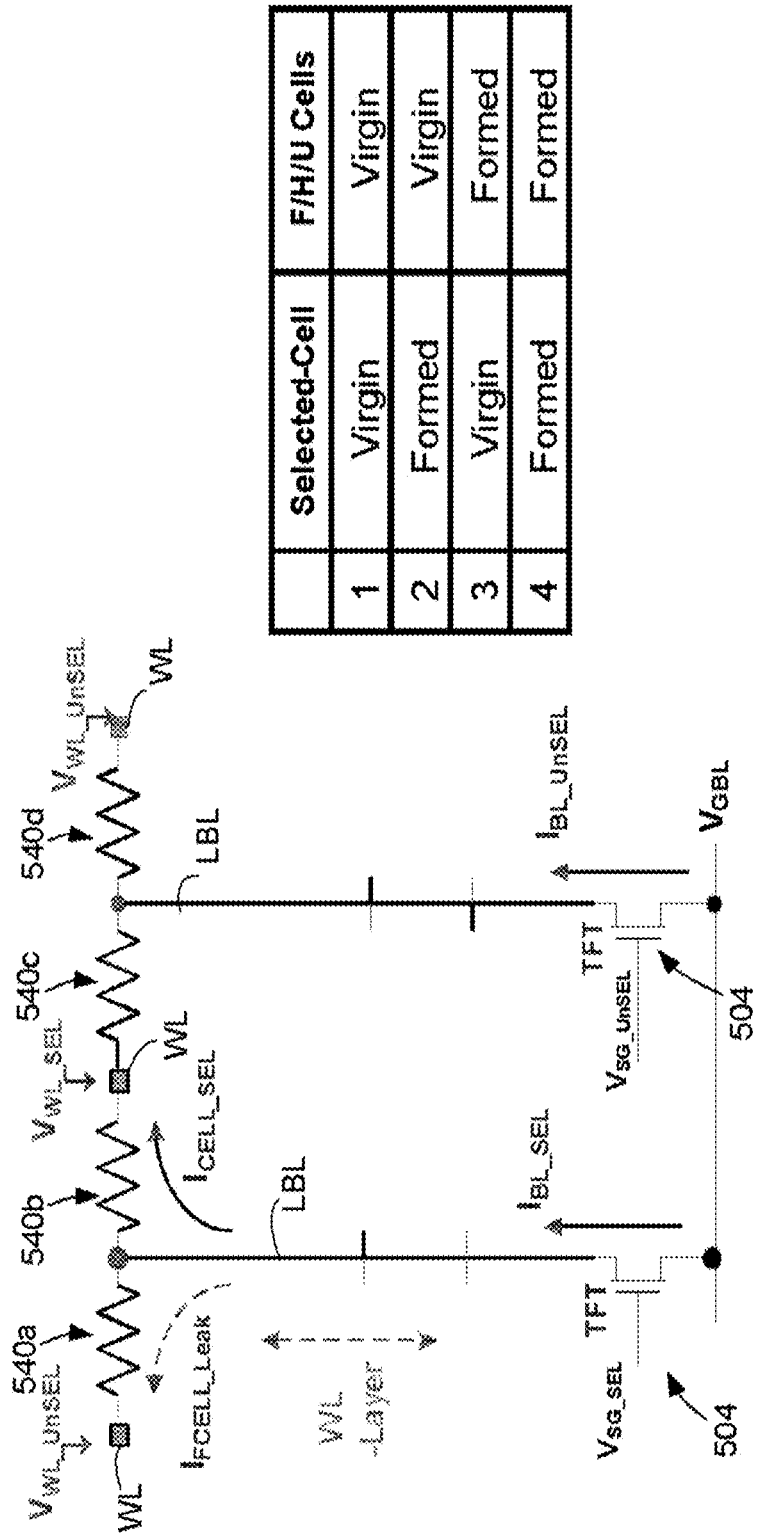
FIG. 10 is a schematic diagram to illustrate some of the concerns pertaining to a selection device.

FIG. 10 is a schematic diagram to illustrate some of the concerns pertaining to a selection device. This example will discuss concerns when FORMING memory elements. Two vertical TFT selection devices 504 are shown connected between a global bit line and the vertically oriented local bit lines. The vertical TFT selection device 504 on the left has a select voltage ($V_{SG\_SEL}$) applied to its gate (e.g., to turn it on). The vertical TFT selection device 504 on the right has an unselect voltage ($V_{SG\_UnSEL}$) applied to its gate (e.g., to keep it off).

As will be discussed more fully below, the vertical TFT selection device 504 has a top junction and a bottom junction, in some embodiments. The top junction is between the body and the top source/drain. The bottom junction is between the body and the bottom source/drain. The following discussion will serve to explain how one junction may need to be able to withstand a greater voltage than the other junction.

A voltage $V_{GBL}$ is applied to the global bit line. Three word lines (WL) are represented. A select voltage ($V_{WL\_SEL}$) is applied to the selected word line in the middle. An unselect voltage ($V_{WL\_UnSEL}$) is applied to the other two word lines.

There are four memory elements 540*a*-540*d*, each represented by a resistor. Each memory element 540 is connected between a local bit line (LBL) and a word line (WL). The table in FIG. 10 indicates that there may be a selected cell and three different types of unselected memory cells (F, H, U). The three different types of unselected memory cells refers to the different voltages that are applied between their bit lines and their word line.

Memory element 540*a* is between the selected bit line and an unselected word line. The current $I_{FCELL\_Leak}$ is shown to represent a leakage current. This is an "F" cell.

Memory element 540*b* is between the selected bit line and the selected word line. Thus, this is the memory element 540*b* undergoing FORMING. The current $I_{CELL\_SEL}$ is shown to represent the current though the select memory cell. Note that the resistance of the selected memory typically drops sharply during FORMING. For example, it could drop from 1 G Ohm to 4 M Ohm, for some types of memory elements.

Memory element 540*c* is between the unselected bit line and the selected word line. This is an "H" cell. Memory element 540*d* is between the unselected bit line and the other unselected word line. This is a "U" cell.

In one embodiment, the FORMING operation is what is referred to herein as a forward FORMING. Example voltages for this FORMING operation are: $V_{GBL}$—about 3V to 6V; $V_{SG\_SEL}$=about 3.5V to 5.5V; $V_{SG\_UnSEL}$=about 0V or $V_{SG\_SEL}$—4V; $V_{WL\_SEL}$=about 0V; $V_{WL\_UnSEL}$=about 2V. Note that $V_{WL\_UnSEL}$ may be equal to about the voltage of the unselected bit line. Note that the global bit line is a high voltage and the selected word line is a low voltage. By convention, this is referred to as a forward FORMING.

When applying forward FORMING voltages, the bottom junction of the TFT could need to withstand a greater voltage than the top junction. In one embodiment, the TFT has a channel extension on the bottom so that it is able to withstand forward FORMING voltages such as, but not limited to, this example.

In one embodiment, the FORMING operation is what is referred to herein as a reverse FORMING. Example voltages for this reverse FORMING operation are: $V_{GBL}$—about 0V; $V_{SG\_SEL}$=about 0.5V to 2.5V; $V_{SG\_UnSEL}$=about 0V; $V_{WL\_SEL}$=about 4V to 5V; $V_{WL\_UnSEL}$=about 2.3V. Note that $V_{WL\_UnSEL}$ may be equal to about the voltage of the unselected bit line. Note that the global bit line is a low voltage and the selected word line is a high voltage. By convention, this is referred to as a reverse FORMING.

When applying reverse FORMING voltages, the top junction of the TFT could need to withstand a greater voltage than the bottom junction. In one embodiment, the TFT has a channel extension on the top so that it is able to withstand reverse FORMING voltages such as, but not limited to, this example.

Whether a forward FORMING operation or reverse FORMING operation is performed may depend on the type of material in the memory element 540. Thus, after it is determined what type of memory element is being used, and hence whether FORMING will be forward or reverse, characteristics of the TFT may be determined.

As noted, the requirements on the vertical TFT selection device 504 may be different for the two cases. For the forward FORMING operation, the bottom junction may be put under greater stress. Thus, the bottom junction may be referred to as a high voltage (HV) junction in that it needs to have a higher breakdown voltage than the top junction, in some embodiments.

As noted, for the reverse FORMING operation, the top junction may be put under greater stress. Thus, the top junction may be referred to as a high voltage (HV) junction in that it needs to have a higher breakdown voltage than the bottom junction, in some embodiments. In one embodiment, a channel extension is used at the top of the vertical TFT selection device 504 to provide for a HV junction at the top.

FIGS. 11A-11G depict various embodiments of a vertical TFT selection device having a body formed from a wide energy band gap semiconductor. The vertical TFT selection devices 504 may be used for selecting vertically oriented bit lines. The device of FIG. 11A will be discussed first. The vertical TFT selection device 504 has a body 501 that is formed a wide energy band gap semiconductor. The wide energy band gap semiconductor is an oxide semiconductor, in one embodiment. The oxide semiconductor is a metal oxide semiconductor, in one embodiment. As one example, the body 501 could be InGaZnO. Other examples for the body 501 include, but are not limited to, InZnO, HfInZnO, ZrInZnO, and ZnInSnO. Thus, the wide band gap semiconductor for the body 501 may be an oxide semiconductor, a metal oxide semiconductor, etc.

The vertical TFT selection device 540 has two source/drain (S/D) regions 503*a*, 503*b* at either end of the body 501. The source/drain regions 503 may also be formed from the wide energy band gap semiconductor. Thus, the source/drain regions 503 could be formed from an oxide semiconductor, a metal oxide semiconductor, etc. Thus, the source/drain regions 503 could be InZnO, HfInZnO, ZrInZnO, ZnInSnO, etc.

However, the source/drain (S/D) regions 503a, 503b could be formed in whole or in part from metal that is adjacent to the wide band gap semiconductor body 501. In one embodiment, the source/drain (S/D) regions 503a, 503b are formed entirely from metal that is adjacent to the wide band gap semiconductor that forms the body 501. In one embodiment, the source/drain (S/D) regions 503a, 503b are formed entirely from wide band gap semiconductor. In one embodiment, the source/drain (S/D) regions 503a, 503b are formed in part from the metal that is adjacent to the wide band gap semiconductor and in part from the wide band gap semiconductor.

In this embodiment, the vertical TFT selection device 504 is a dual gate device, having a gate 507 on each side of the body 501. A gate dielectric 505 extends along the sides of the source/drain regions 503 and the body 501. Thus, the gate dielectric 505 resides between the body 501 and the gates 507. However, the vertical TFT selection device 504 could have a single gate 507. An example material for the gate dielectric 505 is $SiO_2$. A portion of the gate dielectric 505 may also separates the gates 507 from the body or the source/drain 503. In this embodiment, the device 504 is symmetrical, with respect to the gate 507 location relative to the S/D 503a, 503b. In some embodiments, the device 504 has a channel extension, otherwise referred to as a gate/source or gate/drain offset.

The vertical TFT selection device 504 has a top contact 508a and a bottom contact 508b. The bottom contact 508b provides electrical connection to the global bit line 526. The top contact 508a provides electrical connection to the local vertical bit line (not depicted in FIG. 11A). The contacts 508 are formed from TiN in one embodiment. The contacts 508 are formed from TiSi, in one embodiment. Other materials can be used for the contacts 508. A region of oxide 520 is depicted along the sides of the device 504 between the gates 507 and the global bit line 526.

In some embodiments, the body and the source/drain (S/D) are of the same type of conductivity. For example, the body 501 may be n–type and each S/D 503 may be N+. In one embodiment, the transistor will be NFET of depletion type, e.g., at Vg=0 the transistor will be conducting, and a negative gate bias will be needed to shut it off. However, the N+/n/N+ structure can be also be of enhancement type, e.g., at zero gate bias the transistor will be shut off, and at a positive Vg>Vth it will be turned on. For an enhancement type, the work function of the gate material should be high enough to keep the transistor in the off-state when zero gate bias is applied (e.g., Vg=0). An example of such an N+/n/N+ transistor is IGZO (InGaZnO) transistor with gate electrode made of Cu. Other combinations are possible.

In some embodiments, the body 501 and the source/drain (S/D) 503 are of the same type of conductivity, but of p–type. For example, the body 501 may be p–type and each S/D 503 may be P+. In this case, the transistor will be a PFET. Also, the transistor may be of depletion type. For example, it will be conducting at Vg=0. To shut it off, a positive gate bias will be applied, in one embodiment.

However, the body 501 and the source/drain (S/D) 503 are not required to be the same type of conductivity. In other embodiments, the body of the transistor can be p– type and source and drain N+ type. In one embodiment, the N+/p/N+ transistor is an NFET of enhancement type.

In another embodiment, the TFT body 501 can be n–type and source and drain P+. In this case, the transistor will be a PFET of enhancement type. At Vg=0, it will be shut off. To turn the transistor on, a negative bias with absolute value more than the absolute value of negative Vth may be applied.

Also note that the body 501 is not required to be intentionally doped. For example, the body 501 could be intrinsic. This applies for transistors having N+ source/drains (S/D) 503 and for P+ source/drains (S/D) 503.

In one embodiment, the wide band gap semiconductor is not intentionally doped, and can be n–type, p–type or intrinsic. In this case, the transistor source and drain (S/D) are not intentionally doped.

In yet another embodiment, the wide band gap semiconductor is intentionally and uniformly doped, and can be of n– or p–type. The uniform doping in this case may or may not be needed, depending on intrinsic level of doping, and transistor Vth requirements, and also on the requirements of channel-to-S/D series resistance.

In the cases of uniform doping described above, the portions of the wide band gap semiconductor adjacent to the metal electrodes may form source and drain regions 503.

In one embodiment, the body of the transistor can be made of a wide band gap semiconductor with source and drain made in part or in full of metal (or metal stack) that is put in direct contact with the wide band gap semiconductor body. FIG. 11B5 shows one embodiment having metal S/D electrodes 503a, 503b, which are in direct contact with the wide band gap semiconductor body 501. The S/D electrodes 503a, 503b in this case may serve as both the top/bottom contacts 508a, 508b and as at least a part of the S/D regions 503a, 503b.

Thus, the S/D metal electrodes 503a, 503b, which are in direct contact with the wide band gap semiconductor body, can form at least a part of the S/D regions of the TFT transistor. The source and drain regions 503 of such a transistor can be formed in part or in full by the metal region of the S/D electrodes 503. The wide band gap semiconductor may form part of the S/D regions in this case. In one embodiment, the transistor structure may be considered to be a Metal-wide band gap semiconductor-Metal transistor. One embodiment of the example of FIG. 11B5 is such a device. The gate may also be made of metal. In one example, such a device can be made with wide band gap semiconductor body made of InGaZnO, which may be deposited for instance by PVD at 300 C. In one embodiment, the source and drain (S/D) contacts 503 can be made of Al with a Ti barrier. Other source and drain (S/D) contact 503 material options include TiN. Other metal materials can be used for S/D contacts 503 depending on the choice of the wide band gap semiconductor.

However, still other possibilities exist. The possibilities depend on a specific material used for TFT, on process, e.g., how it is deposited, etc. The above may determine the type of conductivity the TFT body may have. The type conductivity and level of doping may also be modulated for a chosen wide band gap semiconductor, by choosing the appropriate process.

FIG. 11B1 depicts one embodiment of vertical TFT selection device 504 having a body 501 formed from a wide energy band gap semiconductor in which the body 501 is n–type and the S/D 503 are N+. In this embodiment, the S/D regions 503a, 503b are heavily doped. The body 501 may instead be intrinsic or undoped. In the embodiment of FIG. 11A, the S/D regions 503a, 503b are not doped. The body 501 may or may not be doped.

FIG. 11B2 depicts one embodiment of vertical TFT selection device 504 having a body 501 formed from a wide energy band gap semiconductor in which the body 501 is p-type and the S/D 503 are P+. In this embodiment, the S/D regions 503*a*, 503*b* are heavily doped. The body 501 may instead be intrinsic or undoped.

FIG. 11B3 depicts one embodiment of vertical TFT selection device 504 having a body 501 formed from a wide energy band gap semiconductor in which the body 501 is p-type and the S/D 503 are N+. In this embodiment, the S/D regions 503*a*, 503*b* are heavily doped. The body 501 may instead be intrinsic or undoped.

FIG. 11B4 depicts one embodiment of vertical TFT selection device 504 having a body 501 formed from a wide energy band gap semiconductor in which the body 501 is n-type and the S/D 503 are P+. In this embodiment, the S/D regions 503*a*, 503*b* are heavily doped. The body 501 may instead be intrinsic or undoped.

Figure 11D:
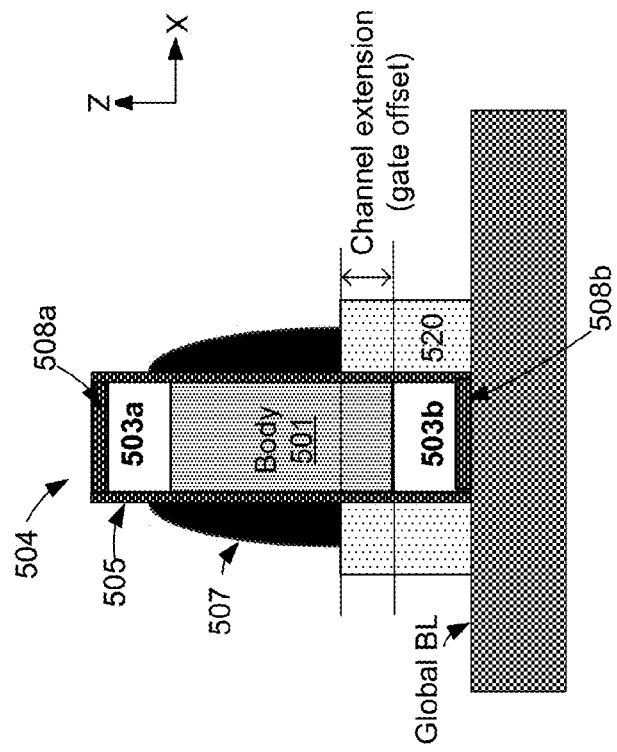
Figure 11C:
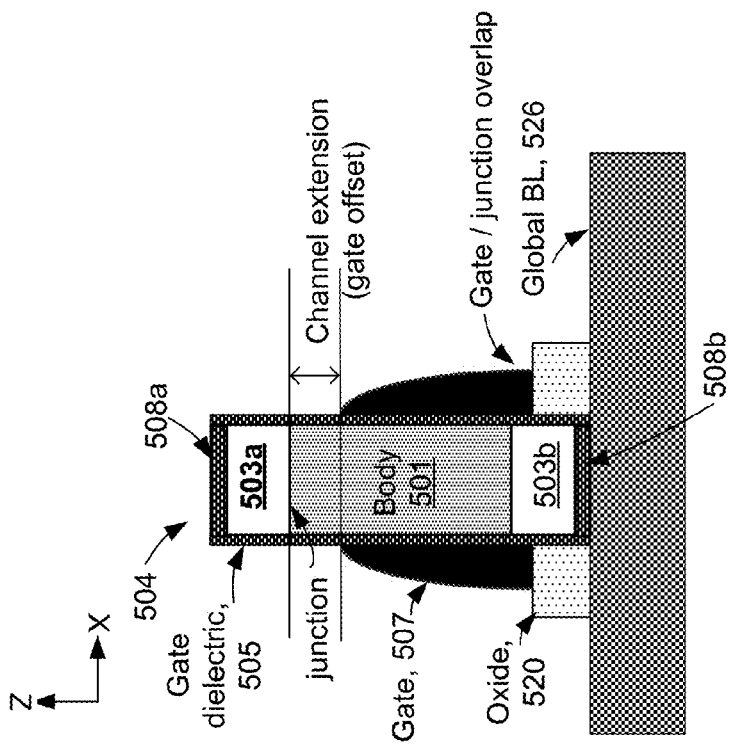

In one embodiment, the vertical TFT selection device 504 has a channel extension. FIGS. 11C and 11D depict embodiments having a channel extension. In both embodiments, the body 501 (as well as S/D 503) is formed from a wide energy band gap semiconductor. The wide energy band gap semiconductor may be formed from similar materials as the device 504 of FIG. 11A. However, one alternative is for at least a portion of the S/D 503 to be formed from metal adjacent to the wide energy band gap semiconductor.

Referring now to FIG. 11C, the channel extension is at the upper portion. The device 504 has an upper junction that is between the body 501 and the upper S/D 503*a*. The device 504 has a lower junction that is between the body 501 and the lower S/D 503*b*. In this example, the S/D 503*a*, 503*b* may be heavily doped. The device of FIG. 11C provides for a HV junction at the top junction. The device 504 is used in a 3D memory array in which the memory elements are FORMED using a reverse forming voltage, in one embodiment.

The body 501 extends past the gates 507 (above the gates), in this embodiment. The body 501 is not extended on the bottom of the TFT 504. That is, the body 501 does not extend past the gates 507 (lower than the gates) at the lower junction. Another way of looking at this is that the gates 507 are offset from the upper isotype junction, in this embodiment. By the gate 507 being offset from the isotype junction, it is meant that the gate 507 is not directly adjacent to the isotype junction. For example, the gates 507 are not directly adjacent to the upper isotype junction. The gates 507 are not offset from the lower isotype junctions in this embodiment. That is, the gates 507 are directly adjacent to the lower isotype junction. Another way of stating the foregoing is that the top portion of the gates 507 does not extend above the upper isotype junction. However, the bottom portion of the gates 507 does extend below the lower isotype junction. In the case the top or/and bottom portion of the gates 507 extend beyond the isotype junction, the structure has respective gate-junction overlap, or gate-source or/and gate/drain overlap.

FIG. 11D shows one embodiment having the channel extension is at the lower portion of the device 504. The device 504 is similar to the one depicted in FIG. 11C, but has the channel extension at the bottom instead. This device is used in a 3D memory array in which the memory elements are FORMED using a forward forming voltage, in one embodiment.

The vertical TFT selection device 504 has a channel extension, which in this example is at the lower portion of the TFT 504. The body 501 extends past (lower than in this case) the gates 507, in this embodiment. The body 501 is not extended on the top of the TFT 504. That is, the body 501 does not extend past (above in this case) the gates 507 at the upper junction.

Another way of looking at this is that the gates 507 are offset from the lower junction in this embodiment. In this case, the gates 507 are not directly adjacent to the lower junction. Instead, there is oxide 520 directly adjacent to the lower junction, in this embodiment. On the other hand, the gates 507 are directly adjacent to the upper junction. Thus, the upper portion of the gates 507 are not offset from the upper junction. Another way of stating the foregoing is that the lower portion of the gates 507 does not extend below the lower junction. However, the top portion of the gates 507 does extend above the upper junction.

The lower source/drain 503*b* is connected to a global bit line in this embodiment. The upper source drain 503*a* could be connected to a vertically oriented bit line (not depicted in FIG. 11D).

The channel extension helps provide for good high voltage operation. The vertical TFT select devices 504 are able to withstand high voltage differences between their source/drain regions 503. For some operations, a relatively high voltage difference results between the two source/drains 503*a*, 503*b*. It is important that the vertically oriented TFT select device 504 does not breakdown. The channel extension results in higher breakdown voltage, which can prevent breakdown during required high voltage operation. The channel extension can also result in much lower leakage during high voltage operation, which is important for the proper cell and array operation.

It is also important that the TFT does not exhibit high leakage current. The channel extension also helps provide for a low leakage current. Note that GIDL could possibly be a problem when operating the vertically oriented TFT select device 504. However, the channel extension helps noticeably reduce or minimize GIDL.

As noted, one alternative to the examples of FIGS. 11C and 11D is for at least a portion of the S/D 503 to be formed from metal adjacent to the wide energy band gap semiconductor. Thus, instead of a top S/D region 503*a* and top contact 508*a*, there may be a top S/D region 503*a* formed from metal. Instead of a bottom S/D region 503*b* and bottom contact 508*b*, there may be a bottom S/D region 503*b* formed from metal. In one embodiment, the S/D metal may be formed as a stack of several metal films made of different materials and deposited in sequence.

In this case, the channel length L can be defined as the length of the wide band gap semiconductor body 501. In other words, this is the distance between the metal S/D regions 503*a*, 503*b*. For the case of the transistor gate overlapping both the source and drain, the length of the gate is longer than the L. Such an example is depicted in FIG. 11B5.

In the case of channel extension similar to FIG. 11C, the channel extension will be the distance from the upper gate edge to the edge of metal S/D occupying the region 503*a*.

In the case of channel extension similar to FIG. 11D, the channel extension will be the distance from the lower gate edge to metal S/D occupying the region 503*b*.

From process prospective, forming such a transistor may start from depositing the bottom S/D metal (and electrode) that would occupy the region 503*b*, then depositing the wide band gap semiconductor, and then depositing the top S/D metal (and electrode) occupying the region 503*a*.

FIG. 11E shows one embodiment of a vertical TFT selection device 504 having a single gate. The device is similar to the one of FIG. 11C in that it has a channel extension on the upper portion of the TFT selection device 504. FIG. 11F shows one embodiment of a vertical TFT selection device 504 having a single gate. The device 504 is similar to the one of FIG. 11D in that it has a channel extension on the lower portion of the TFT selection device 504. Other gate configurations are possible.

In the embodiments of FIGS. 11E and 11F, the body (as well as source and drain) of the TFT is formed from a wide energy band gap semiconductor. The wide energy band gap semiconductor is an oxide semiconductor, in one embodiment. The wide energy band gap semiconductor is a metal oxide semiconductor, in one embodiment. As one example, the body 501 could be InGaZnO. Other examples include, but are not limited to, InZnO, HfInZnO, ZrInZnO, and ZnInSnO.

Figure 11G:
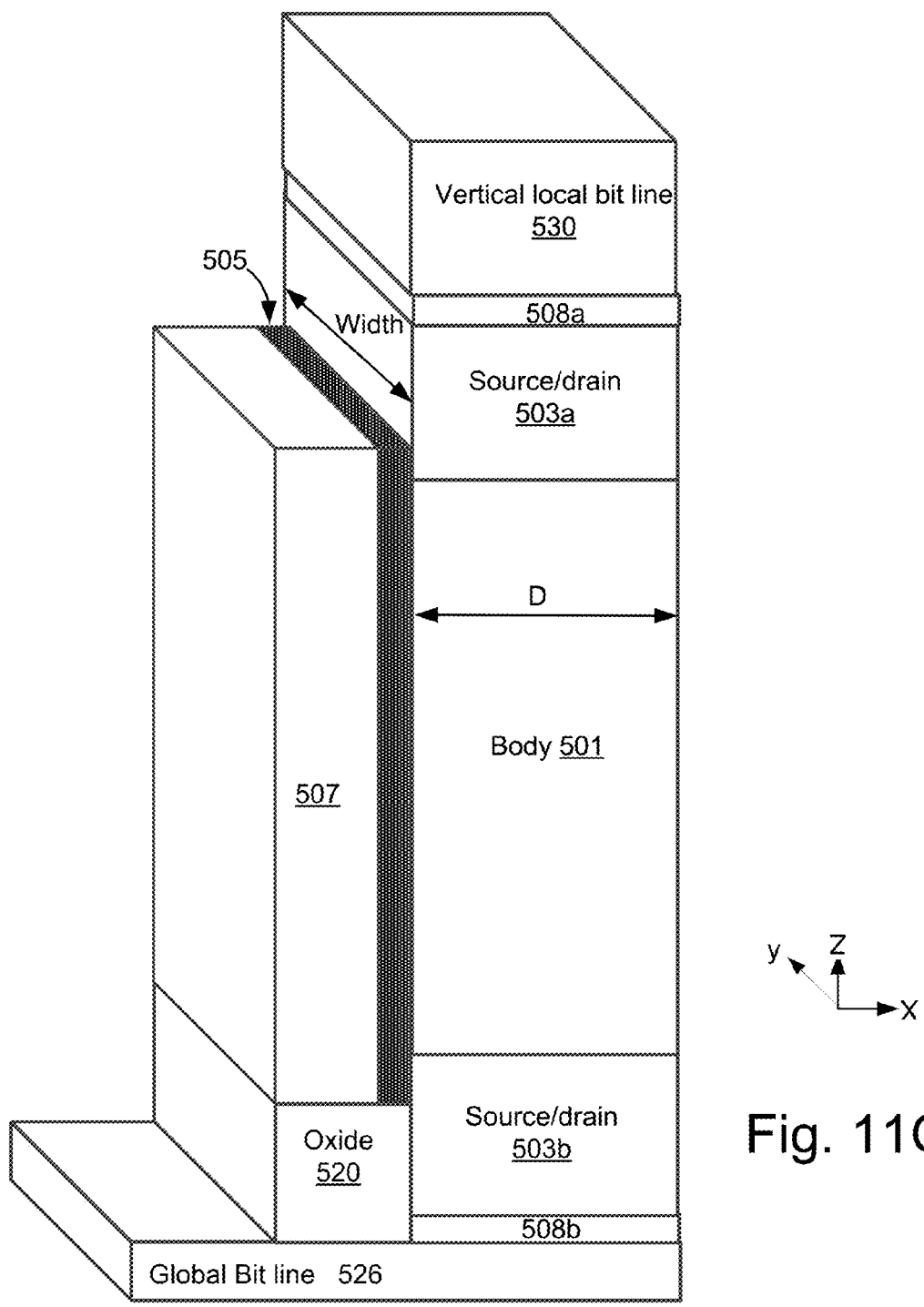
FIG. 11G depicts a perspective view of one embodiment of a vertical TFT selection device.

FIG. 11G shows a perspective view of one embodiment of a vertical TFT selection device 504 having a single gate and a body 501 formed from a wide band gap semiconductor. The TFT 504 could have a second gate (and gate dielectric) on the opposite side of the body 501. The lower source/drain is connected to lower contact 508b, which is connected to a global bit line. The upper source/drain is connected to an upper contact 508a, which is connected to a vertical local bit line. A channel extension is not depicted in FIG. 11G. However, the device 504 could have a channel extension, as discussed herein.

The lower source/drain 503b and the upper source drain 503a are formed from the wide band gap semiconductor in one embodiment. The lower source/drain 503b and the upper source drain 503a are formed from metal in one embodiment. The lower source/drain 503b and the upper source drain 503a are formed in part from metal and in part from the wide band gap semiconductor, in one embodiment.

Example dimensions of the vertical TFT selection device 504 are as follows. The height may be about 120-180 nm. The TFT height can also be smaller or bigger depending on requirements for cell and array operation. Here, the height of the device includes source, drain and channel regions. With the fixed source and drain junction depths, the bigger the overall height, the bigger the channel length.

The body, as well as source/drains, has a thickness "D". In one example, the body thickness is close to the vertical local BL half pitch. An example range of the thickness is 24-48 nm, but this could be smaller or larger. The body, as well as source/drains, have a width (dimension in the direction of WLs, in one example, may be close to the WL half pitch) that may be about 24-48 nm, but this could be smaller or larger. The gate dielectric may be about 5 nm. However, the gate dielectric may be thicker or thinner.

If a channel extension is used, the channel extension may be between about 10 nm to 30 nm, as one example range. Here, the channel extension refers to the distance between the end of the gate and the S/D junction position (or the start of the source/drain).

The global bit line 526 might be metal, highly doped polysilicon, etc. The global bit line 526 could be a combination of materials. For example, the lower portion could be metal, whereas the upper portion (nearest the TFT 504) could be highly doped polysilicon. As one example, the global bit line can be tungsten (at least in part). In the embodiment depicted in FIG. 11G, there is a lower contact 508b between the lower source/drain 503b and the global bit line 526. The lower contact 508b may be TiN, SiN, or another material. Depending on the material selection for the global bit line 526, the lower contact 508b may not be needed.

Note that the vertical bit line material may serve as one of the electrodes of read-write memory elements. In one embodiment, the material of the vertical BL 530 is N+ polysilicon. For some types of memory cells, N+ polysilicon serves as a better electrode choice (on the BL side) to achieve desired operation of a specific memory cell and memory array.

However, for other memory cells with different material composition, P+ polysilicon may be a better choice as an electrode (on BL side) to ensure desired operation of the memory cell and array. This may be due to the fact that P+ polysilicon work function is different from N+ polysilicon, and may be more suitable for the electrode material to enable the most efficient memory cell operation. Thus, the vertical bit line material is P+ polysilicon, in one embodiment. In one embodiment, the vertical bit line is formed from a metal.

In the example depicted in FIG. 11G, the TFT select device 504 has an upper contact 508a. The upper contact 508a may be formed from TiN, SiN, etc. Note that the upper contact 508a may not be required for at least some vertical bit line 530 materials. Thus, in some embodiments, the upper contact 508a is not used.

Figure 12A:
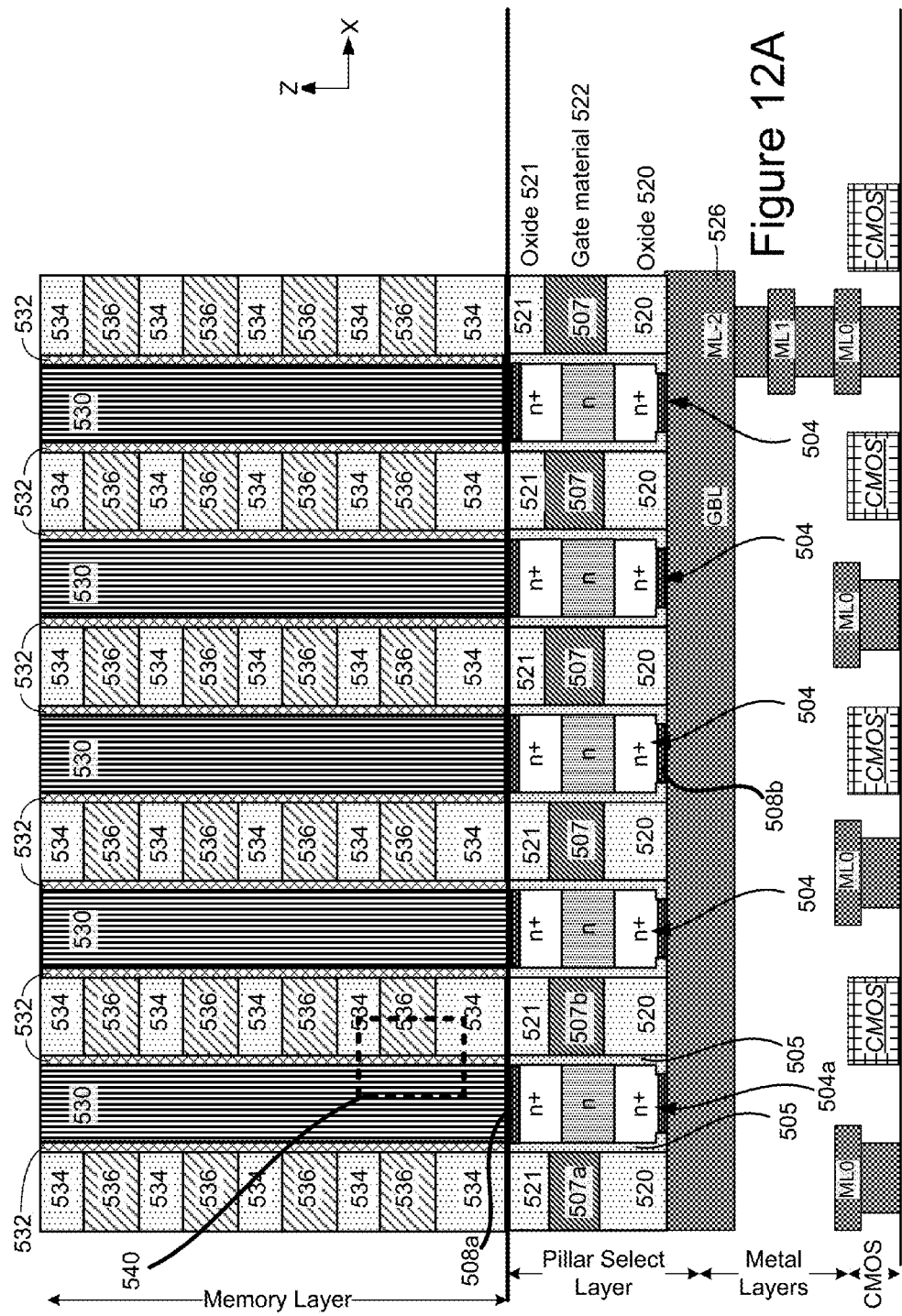
FIG. 12A is a cross-sectional view of a memory structure using one embodiment of a vertically oriented TFT select device and the memory structure of FIG. 6.

FIG. 12A is a cross-sectional view of a memory structure using one embodiment of a vertically oriented TFT select device 504 and the memory structure of FIG. 6. The vertical TFT selection device 504 has a body 501 that is formed a wide energy band gap semiconductor. Likewise, the source and drain are formed from the wide energy band gap semiconductor. The wide energy band gap semiconductor is an oxide semiconductor, in one embodiment. The oxide semiconductor is a metal oxide semiconductor, in one embodiment. As one example, the body 501 could be InGaZnO. Other examples for the body 501 include, but are not limited to, InZnO, HfInZnO, ZrInZnO, and ZnInSnO. Thus, the wide band gap semiconductor for the body 501 may be an oxide semiconductor, a metal oxide semiconductor, etc.

For convenience of explanation, the TFT select device 504 is depicted as an N+/n/N+ device in FIGS. 12A-12C. However, the TFT select device 504 could have other configurations, such as P+/p/P+, P+/n/P+, N+/p/N+, etc. Depending on process and the specific body material, the level of doping can be different. An example range of body doping can be $1 \times 10^{17}$ to $1 \times 10^{18}$ cm$^{-3}$. However, it can be lower or higher. The body can be undoped or intrinsic. Undoped in this context means not intentionally doped. Note that an undoped or intrinsic body may have a low level of impurities. Depending on TFT threshold voltage (Vth) requirements, intentionally doping the body may or may not be required.

Also note that the TFT select device 504 could be a metal-wide band gap semiconductor-metal TFT, as described earlier herein. Note that the wide band gap semiconductor does not need to be intentionally doped. Also, it could be doped uniformly. Thus, the non-uniform doping (e.g., N+/n/N+) is not required.

The TFT select devices 504 each have a channel extension, otherwise referred to as a gate/channel offset, in this embodiment. In this example, the channel extension is at the lower portion of the TFT 504. The channel extension is not a requirement.

The memory layer includes a set of vertical bit lines 530. In one embodiment, the vertical bit lines 530 are n+ polysilicon. In one embodiment, the vertical bit lines 530 are p+ polysilicon. In one embodiment, the vertical bit lines 530 are metal. The choice of material for the vertical bit lines 530 may depend on the type of memory cells in use. The VBL material may be in direct contact with the memory cell switching material. In other words, the VBL material may form one of the electrodes of the memory cell. Depending on the memory cell material, its switching properties may be better depending on the choice of the electrode material, with doping of N+ or P+ type. The choice of VBL material may depend on the properties of memory cell.

For configurations having an N+ VBL, NFET TFT may be more suitable than PFET, since a TFT S/D of N+ type would make a good electrical contact with VBL material of the same N+ type of conductivity. In another embodiment, the VBL is made of P+ type material. In this case, a TFT PFET may be more suitable, since its S/D of P+ type would make a good electrical contact with VBL material of the same P+ type. Thus, the choice of PFET or NFET may ultimately depend on properties of the memory cell.

In the example depicted in FIG. 12A, the TFT select devices 504 have an upper contact 508a. The upper contact 508a may be formed from TiN, SiN, etc. Note that the upper contact 508a may not be required for at least some vertical bit line 530 materials. Thus, in some embodiments, the upper contact 508a is not used.

Interspersed between the vertical bit lines 530 are alternating oxide layers 534 and word line layers 536. In one embodiment, the word lines are made from TiN. Between the vertical bit lines 530 and the stacks of alternating oxide layers 534 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate.

Directly below each vertical bit line 530 are the vertically oriented TFT select devices 504, each of which comprises (in one example embodiment) an n+/n−type/n+ TFT. Each n+ region may be referred to as a source/drain. The upper source/drain is connected to the vertical bit line 530 by an upper contact 508a. The n−type region may be referred to as a body. The n−type region may serve as the channel of the TFT during operation.

Each of the vertically oriented TFT select devices 504 has dielectric layers 505 on each side. The dielectric layers 505 are oxide, in one embodiment. In this embodiment, each TFT has two gates. Referring to TFT 504a, there is a gate 507a to the left and a gate 507b to the right.

In FIG. 12A, the channel is not extended on the top of the TFT 504. That is, the n−type region (or body) of each TFT 504 does not extend past (above in this case) the gate material 522.

The TFT is connected to the global bit line (GBL) 526 by the lower contact 508b. The GBL 526 may be formed from metal, heavily doped polysilicon, or a combination of layers of metal and heavily doped polysilicon. As can be seen, the TFT 504 can be used to connect the global bit line GBL (layer 526) with any of the vertical bit lines 530.

The channel extension helps provide for good high voltage operation. The vertical TFT select devices 504 are able to withstand high voltage differences between their source/drain regions. For some operations, a relatively high voltage difference is applied between the global bit line 526 and the word lines. Therefore, a high voltage may result between the two source/drains of an unselected vertically oriented TFT select device 504. It is important that the vertically oriented TFT select device 504 does not breakdown. The channel extension prevent breakdown during high voltage operation.

It is also important that the select device does not exhibit high leakage as explained above. The channel extension also helps provide for a low leakage current. Note that GIDL could possibly be a problem when operating the vertically oriented TFT select device 504. However, the channel extension helps reduce GIDL and prevent adverse impact of GIDL on TFT selection device 504 and array operation.

Note that TFT breakdown may represent a catastrophic failure, after which the TFT selection device will cease to operate as transistor. This may lead to the failure of the memory chip as a whole.

High GIDL could also damage the TFT due to hot carriers injected to the gate dielectric due to high field in the direction perpendicular to the gate dielectric. This may lead to interface and bulk trap accumulation in the gate dielectric, leading to TFT selection device performance degradation and reliability issues.

As described below, the memory structure of FIG. 12A is a continuous mesh array of memory elements because there are memory elements connected to both sides of the bit lines and memory elements connected to both sides of the word lines. At the bottom of FIG. 12A, the CMOS substrate is depicted. Implemented on the top surface of the CMOS structure are various metal lines including ML-0, ML-1, and ML-2. Line 526 of ML-2 serves as a respective global bit line (GBL). The Pillar Select Layer includes two oxide layers 520, 521 with a gate material layer 522 sandwiched there between. The oxide layers 520, 521 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Tungsten (W), Titanium Nitride, Tantalum Nitride, Nickel Silicide or any other suitable material. Gate material 522 implements the row select lines $SG_x$ (e.g., $SG_1$, $SG_2$, . . . of FIG. 1), which are labeled in FIG. 12A as row select lines 507. Portions of the row select lines may also be referred to a transistor gates.

FIG. 12A shows six row select lines ($SG_x$) 507 in the gate material layer 522, each underneath a stack of multiple word lines. As can be seen, each of the row select lines 507 is positioned between two vertically oriented select devices 504, above and not in the substrate. Therefore, each row select line can serve as the gate signal to either of the two neighboring vertically oriented TFT select devices 504; therefore, the vertically oriented TFT select devices 504 are said to be double gated. Each vertically oriented TFT select device 504 can be controlled by two different row select lines, in this embodiment.

FIG. 12B is a cross-sectional view of another embodiment of a memory structure using a vertically oriented TFT select device 504 having the channel extension is at the lower portion of the TFT select devices 504. This is similar to the TFT 504 discussed in FIG. 11D in combination with the memory structure of FIG. 6. However, the top 508a and bottom contacts 508b are not depicted in FIG. 12B. The top 508a and bottom contacts 508b may or may not be used, depending on factors such as the material selected for the vertical bit lines 530 and global bit line 526.

FIG. 12B shows the TFT as an NFET, with vertical bit lines made of material (e.g., polysilicon) of N+ type. For such a configuration, NFET TFT may be more suitable than PFET, since a TFT S/D of N+ type would make a good electrical contact with VBL material of the same N+ type of conductivity. In another embodiment, the VBL is made of P+ type material. In this case, a TFT PFET may be more suitable, since its S/D of P+ type would make a good electrical contact with VBL material of the same P+ type.

As noted, the TFT select devices 504 each have a channel extension, otherwise referred to as a gate/channel offset, in some embodiments. However, the channel extension is not a requirement. In this example, the channel extension is at the lower portion of the TFT select devices 504. That is, there is a gate/junction offset at the lower body/source junction, but not at the upper body/drain junction. In one embodiment, the memory elements are FORMED using a forward forming voltage in which the global bit line voltage is greater than the selected word line voltage.

FIG. 12C is a cross-sectional view of another embodiment of a memory structure using the vertically oriented TFT select device 504 discussed in FIG. 11C and the memory structure of FIG. 6. The TFT select devices 504 each have a channel extension, otherwise referred to as a gate/channel offset. In this example, the channel extension is at the upper portion of the TFT select devices 504. That is, there is a gate/junction offset at the upper body/drain junction, but not at the lower body/source junction. In one embodiment, the memory elements are FORMED using a reverse forming voltage in which the global bit line voltage is less than the selected word line voltage.

The channel extension is not a requirement. Thus, the vertically oriented TFT select device 504 discussed in FIGS. 11A and/or 11B1-11B4 may also be used with the memory structure of FIG. 6. Also, the device is not required to have two gates. Thus, the vertically oriented TFT select device 504 discussed in FIGS. 11E and/or 11F may also be used with the memory structure of FIG. 6.

Figure 13:
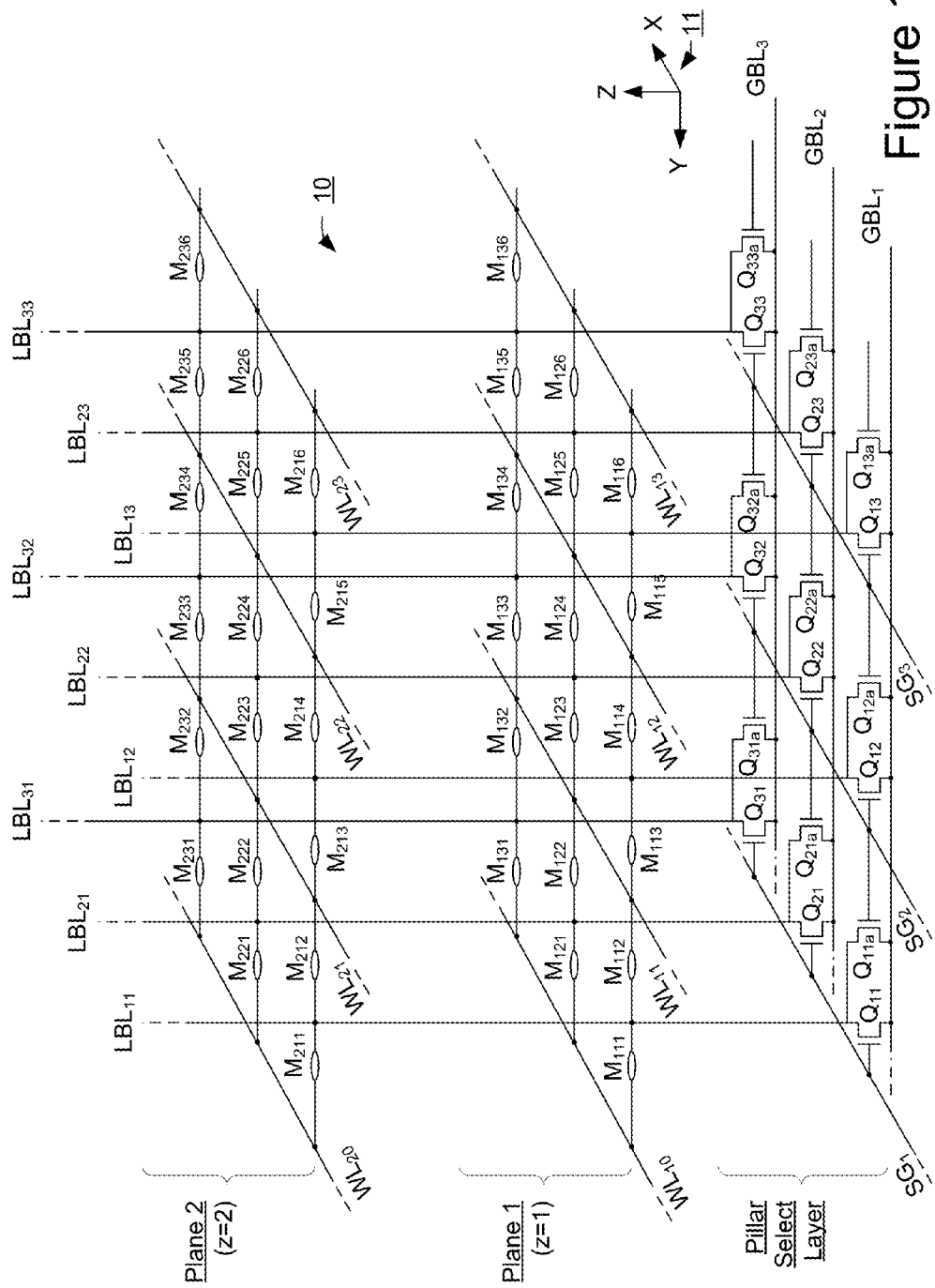
FIG. 13 is a schematic of a portion of the memory system, depicting vertical bit lines and vertically oriented select devices above the substrate.

FIG. 13 is a partial schematic of the memory system of FIGS. 12A, 12B, and 12C depicting the above-described double-gated structure for the vertically oriented TFT select devices 504. Planes 1 and 2 of FIG. 11 are the same as in FIG. 1. As can be seen, each local bit line LBL is connectable to a respective global bit line GBL by two row select signals. FIG. 13 shows two transistors connecting to each local bit line. For example, transistor $Q_{11}$ can connect local bit line $LBL_{11}$ to global bit line $GBL_1$ in response to row select line $SG_1$ and transistor $Q_{11a}$ can connect local bit line $LBL_{11}$ to global bit line $GBL_1$ in response to row select line $SG_2$. The same structure is used for the other local bit lines depicted in FIG. 13.

Figure 14:
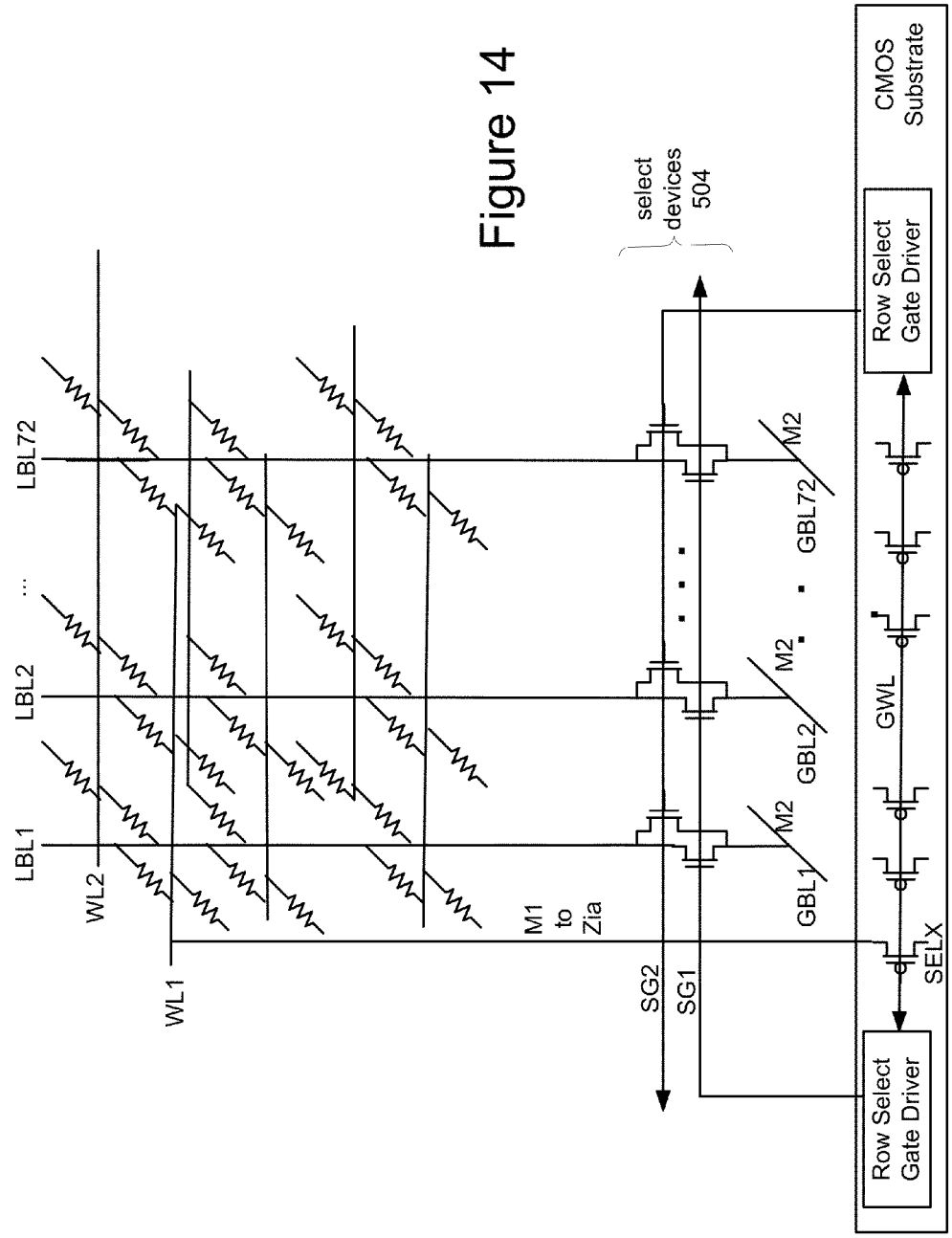
FIG. 14 is a schematic of a portion of the memory system, depicting vertical bit lines, vertically oriented select devices above the substrate and row select line drivers in the substrate.

FIG. 14 shows another partial schematic also depicting the double-gated structure such that each local bit line (LBL1, LBL2, . . . LBL72) are connected to their respective global bit lines (GBL1, GBL2, . . . GBL72) by any of two respective vertically oriented TFT select devices that are positioned above the CMOS substrate. As can be seen, while the double-gated structure of FIGS. 12A and 12B include positioning the various select devices 504 above the substrate, the Row Select Line Drivers providing the row select lines $SG_1$, $SG_2$, . . . are positioned in the substrate. Similarly, the global word lines (e.g., GWL) are position in a metal layer on the substrate and below the vertically oriented select devices. Furthermore, as will be explained below, in one embodiment the Row Select Line Driver uses the appropriate global word line GWL as an input.

Figure 15A:
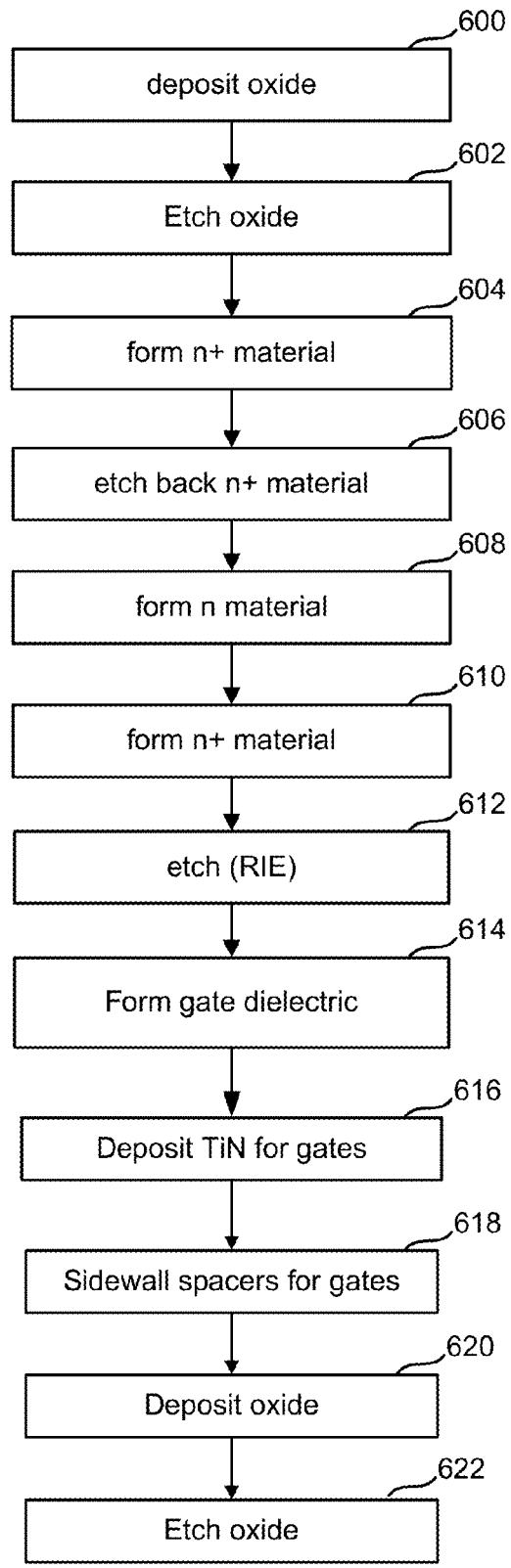
FIG. 15A is a flow chart describing one embodiment of a process for fabricating the structure of FIG. 12B.

FIG. 15A is a flow chart describing one embodiment for manufacturing a Pillar Select Layer having a vertical TFT selection device 504. This process may be used to form the Pillar Select Layer depicted in FIG. 12B. FIGS. 16A-16H show results after various steps. In this embodiment, the vertical TFT selection devices 504 have their channel extensions on the bottom. The process can be modified to form vertical TFT selection devices 504 having their channel extensions on the top. The process can be modified to form vertical TFT selection devices 504 without channel extensions. The process can be modified to form vertical TFT selection devices 504 that are metal-wide band gap semiconductor-metal.

Note that other processes can be used form the vertical TFT selected device 504. In FIG. 15A, the TFT is an embodiment that is N+/n–type/N+. The TFT 504 is not required to be N+/n–type/N+. The process can be modified for other devices. Thus, the process could be modified to form a vertical TFT selected device 504 such as, P+/p–type/P+, N+/p–type/N+, P+/n–type/P+, N+/intrinsic/N+, P+/intrinsic/P+, etc. In FIG. 12B, the TFT 504 is connected to the vertical bit line 530 without a top contact 508a. Thus, formation of a top contact 508a is not depicted in the discussion of FIG. 15A. However, the process can be modified to form a top contact 508a. In FIG. 12B, the TFT 504 is connected to the global bit line 526 without a bottom contact 508b. Thus, formation of a bottom contact 508b is not depicted in the discussion of FIG. 15A. However, the process can be modified to form a bottom contact 508b.

This process can be performed after manufacturing the metal layers and substrate layers (e.g., drivers and other logic), and before manufacturing the memory layer. The substrate layers, metal layers and memory layers can be manufactured using other processes known and/or described elsewhere. In step 600, oxide for the lower oxide layer 520 is deposited above the metal layer. In one embodiment, the metal layer is tungsten. For example, Chemical Vapor Deposition (CVD) can be used to deposit $SiO_2$. In step 602, the oxide is etched. FIG. 16A depicts results after step 602. FIG. 16A shows oxide layer 520 having been deposited over metal 526 and having been etched to form a pattern. The oxide layer 520 may be formed such that its height is above the point where the lower source/drain 503b will eventually start. That is, the oxide 520 may be higher than the eventual highest point of the lower S/D 503b. This will allow the gate to be offset from the lower S/D 503b. To form a memory array such the one in FIG. 12C, one option is to form an oxide layer having a lower height. This latter option will allow the gate to be formed without any offset from the lower S/D 503b. This latter option could also be used when forming a TFT 505 having no channel extension at either the top or bottom.

In step 604, n+ wide energy band gap semiconductor is formed over the oxide layer 520. FIG. 16B depicts results after step 604, showing n+ wide energy band gap semiconductor 1618 over the oxide layer 520. The n+ wide energy band gap semiconductor may be doped in situ or after depositing the wide energy band gap semiconductor. Note that if doping is performed after deposition, other layers could be added prior to doping. In one embodiment, $NH_3$ plasma treatment is used to reduce series resistance (higher N+ doping concentration). In one embodiment, the source and/or drain regions are exposed to argon (Ar). This may be Ar plasma treatment. As non-limiting examples, Ar or N may be used either for in-situ doping or ion implantation. In FIG. 16B (as well as 16C-16H) the diagram is simplified relative to FIG. 16A by not depicting the lower metal layers M0, M1.

In step 606, the n+ wide energy band gap semiconductor 1618 is etched back. FIG. 16C depicts results after step 606, showing n+ wide energy band gap semiconductor having been etched back such that now there are recesses 1619 between portions of the oxide layer 520. The n+ wide energy band gap semiconductor may be etched to a lower height than the final body/source junction height to account for diffusion of dopants during later process steps, such as anneals. The recesses 1619 may be provide for an alignment mark for a mask that will be used to etch wide energy band gap semiconductor that will be the upper source/drains 503a and bodies 501 of the TFTs 504 (in step 612).

In step 608, an n-type layer of wide energy band gap semiconductor is formed over the lower n+ wide energy band gap semiconductor. One option is to form this layer without intentionally doping. In step 610, an n+ layer of wide energy band gap semiconductor is formed over the n-type layer. FIG. 16D depicts results after step 610 showing n-type layer 1622 and n+ layer 1624. In one embodiment, wide energy band gap semiconductor is deposited for both layers 1622, 1624 without any intentional doping (e.g., intrinsic). Later, an impurity can be introduced to the top layer 1624, and optionally, to the middle layer 1622 (for the body). The wide energy band gap semiconductor that was deposited without any intentional doping may end up being n-type. Thus, in one embodiment, the n-type wide energy band gap semiconductor is formed without intentionally doping that layer.

Next, n+ layer 1624 is formed by implanting a dopant using a suitable energy level. Note that the lower n+ layer of wide energy band gap semiconductor could be doped after layer 1624 is formed by using a suitable energy level to implant at the appropriate depth. In one embodiment, $NH_3$ plasma treatment is used to reduce series resistance (higher N+ doping concentration). In one embodiment, the source and/or drain regions are exposed to argon (Ar). This may be Ar plasma treatment. As non-limiting examples, Ar or N may be used either for in-situ doping or ion implantation.

In step 612, etching is performed to form pillars for the vertical TFT selected devices. FIG. 16E depicts results after step 612, showing several pillars 1625. Each pillar 1625 has lower n+ region (source 503b), n-type region (body 501), and upper n+ region (drain 503a). The lower body/source junction is depicted in its final position in FIG. 16E. Note that some mis-registration between the lower n+ region and the n-type region, as well as the top n+ region, is not critical. As previously noted, the recesses 1619 may serve as an alignment mark for the mask that is used to etch these pillars 1625.

In step 614, a gate dielectric is formed. FIG. 16F depicts results after step 614 showing the gate dielectric material 1628 over the pillars 1625. In one embodiment, the gate dielectric material 1628 is formed by ALD of silicon oxide. In one embodiment, the gate dielectric material 1628 is formed by ALD of hafnium oxide. In one example implementation, the gate dielectric layer 1628 will be approximately 3 to 10 nanometers thick.

In step 616, material is deposited for the gates. In one embodiment, TiN is deposited. The gate material could be W, as another example. In one embodiment, the gate material is polysilicon, which may be doped as deposited or doped later for high conductivity. In step 618, the gate material is etched to form the gates. For example, reactive ion etching (RIE) is used. FIG. 16G depicts results after step 618, showing gates 507. In this embodiment, each TFT has two gates 507. In another embodiment, a TFT has a single gate. In one embodiment, the TiN (or other gate material) is deposited over the gate dielectric material in a more or less conformal layer. Etching back the gate material (e.g., TiN) creates the structure of FIG. 16G. The channel extension is at the lower portion of the TFTs 504.

In step 620, another layer of oxide is formed. In step 622, the oxide is etched back. FIG. 16H depicts results after step 622, showing upper oxide layer 521. For example, CVD can be used to deposit $SiO_2$.

Figure 15B:
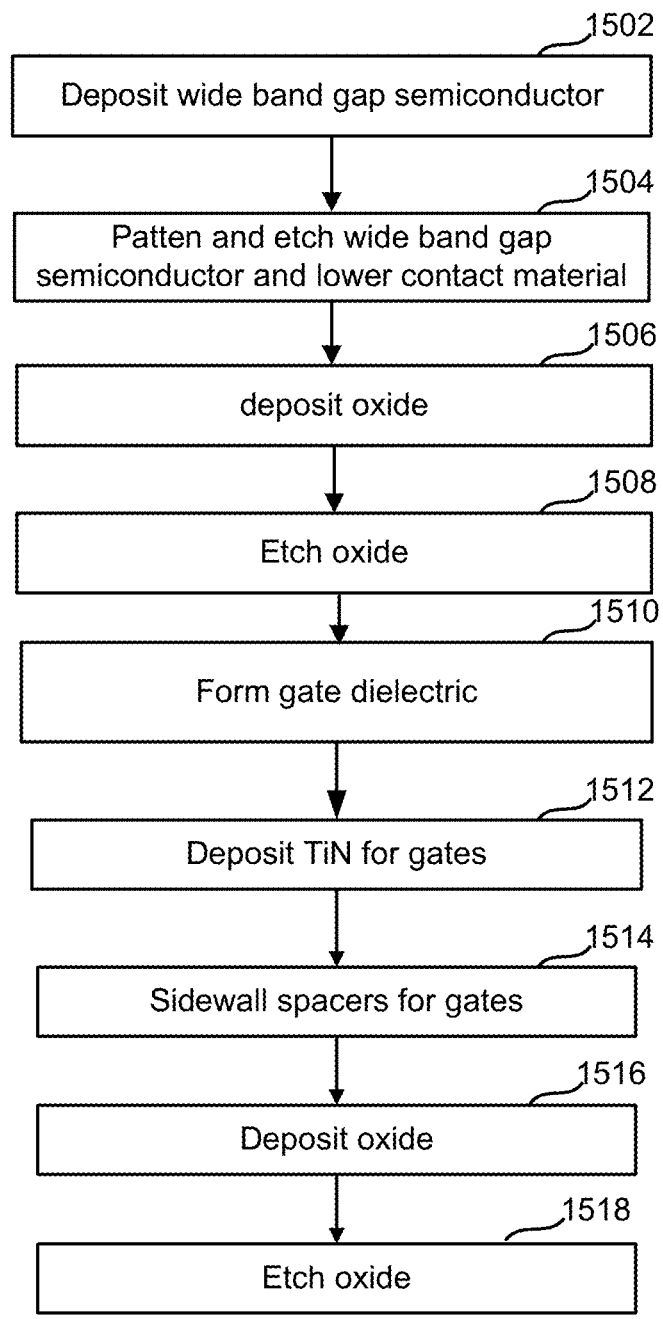
FIG. 15B is a flow chart describing one embodiment of a process for fabricating the structure.

FIG. 15B is a flow chart describing one embodiment for manufacturing a Pillar Select Layer having a vertical TFT selection device 504. This process may be used to form a Pillar Select Layer in which the vertical TFT selection devices 504 have their channel extensions on the top. FIGS. 17A-17F depict results after various steps. The process can be modified to form vertical TFT selection devices 504 having their channel extensions on the bottom. The process can be modified to form vertical TFT selection devices 504 without channel extensions.

In FIG. 15B, the TFT is an embodiment that is N+/n-type/N+. The TFT 504 is not required to be N+/n-type/N+. The process can be modified for TFTs having other conductivity and/or doping concentrations. Thus, the process could be modified to form a vertical TFT selected device 504 such as, P+/p-type/P+, N+/p-type/N+, P+/n-type/P+, N+/intrinsic/N+, P+/intrinsic/P+, etc. The process can be modified to form vertical TFT selection devices 504 that are metal-wide band gap semiconductor-metal.

The formation of a top contact 508a is not depicted in the discussion of FIG. 15A. However, the process can be modified to form a top contact 508a. In FIG. 15B, the formation of a bottom contact 508b is not depicted. However, the process can be modified to form a bottom contact 508b.

This process can be performed after manufacturing the metal layers and substrate layers (e.g., drivers and other logic), and before manufacturing the memory layer. The substrate layers, metal layers and memory layers can be manufactured using other processes known and/or described elsewhere. In step 1502, a wide energy band gap semiconductor is formed over the global bit line 526. This may be in direct contact with the global bit line 526. Alternatively, one or more other layers could be between the global bit line 526 and the wide energy band gap semiconductor. As one example, material for the lower contact 508b (if used) may be therebetween.

Figure 17A:
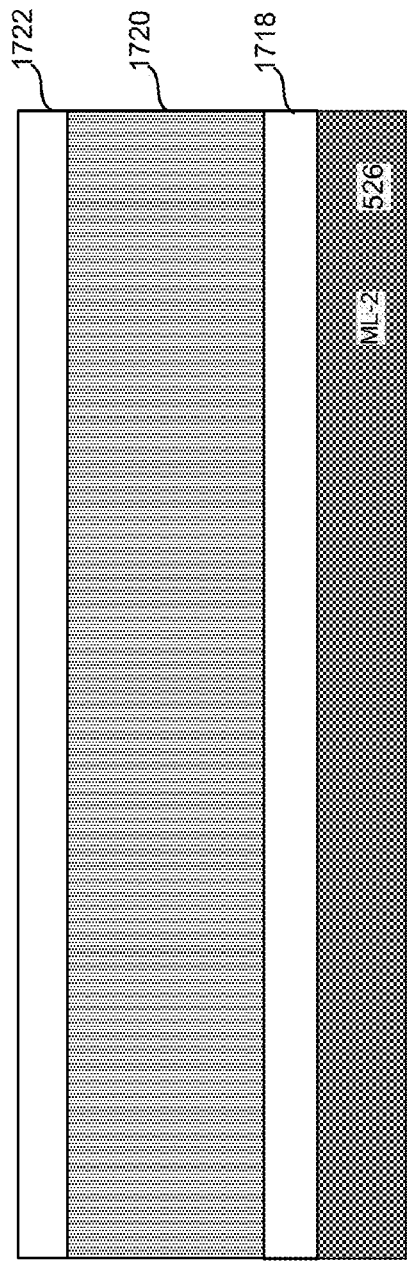
FIGS. 17A-17F depict the structure being formed during the process of FIG. 15B.

FIG. 17A depicts results after step 1502. The wide energy band gap semiconductor has three layers 1718, 1720, 1722, which will serve as the basis for the source 503b, body 501, and drain 503a, respectively. In one embodiment, the layers 1718, 1722 for the source and drain are doped. However, doping is not required. The doping may be in situ, or performed after depositing the wide energy band gap semiconductor. In one embodiment, $NH_3$ plasma treatment is used to reduce series resistance (higher N+ doping concentration). In one embodiment, the source and drain layers 1718, 1722 are exposed to argon (Ar). This may be Ar plasma treatment. As non-limiting examples, Ar or N may be used either for in-situ doping or ion implantation of the source and/or drain layers 1718, 1722.

Figure 17B:
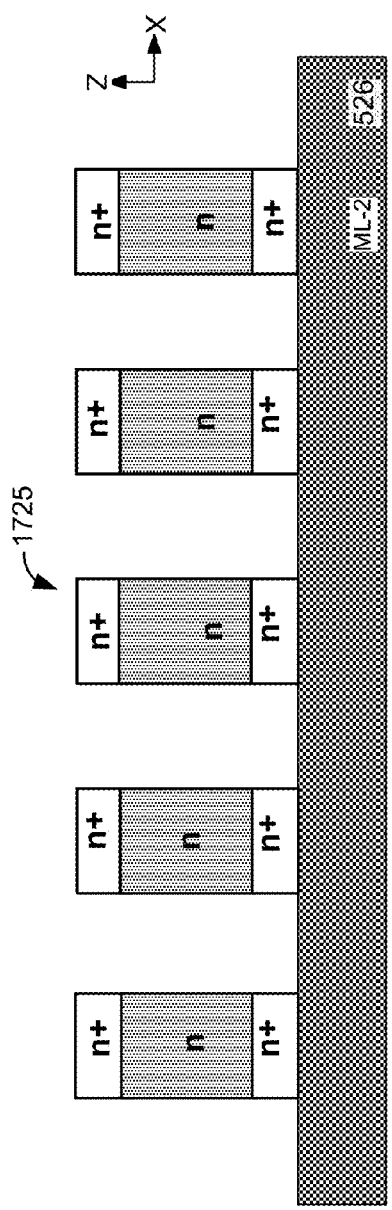

In step 1504, the wide energy band gap semiconductor is patterned and etched. FIG. 17B depicts results after step 1504, showing several pillars 1725. Each pillar 1725 has lower n+ region (source 503b), n-type region (body 501), and upper n+ region (drain 503a). The lower body/source junction is depicted in its final position in FIG. 17B.

Figure 17C:
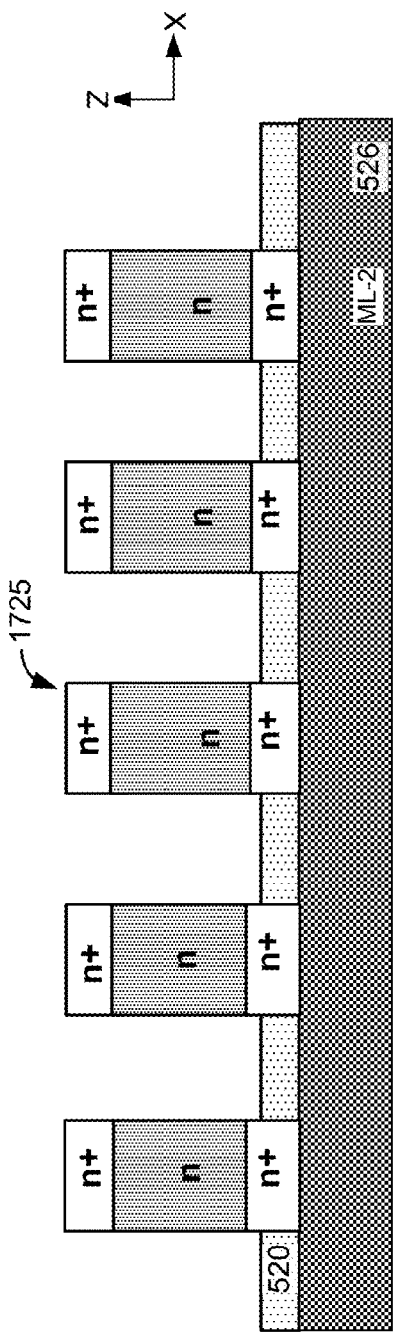

In step 1506, oxide for the lower oxide layer 520 is deposited above the metal layer and between the pillars 1725. For example, Chemical Vapor Deposition (CVD) can be used to deposit $SiO_2$. In step 1508, the oxide is etched. FIG. 17C depicts results after step 1508. FIG. 17C shows oxide layer 520 having been deposited over metal 526 and between the pillars 1725. The oxide layer 520 may be formed such that its height is below the junction of the body and lower source/drain 503*b*. That is, the oxide 520 may be lower than the eventual highest point of the lower S/D 503*b*. In this technique, a channel extension is not being formed on the lower side of the TFT 504. To form a TFT having a channel extension on the lower side, one option is to form an oxide layer 520 having a higher height. This latter option will allow the gate to be formed with a channel offset at the lower S/D 503*b*.

Figure 17D:
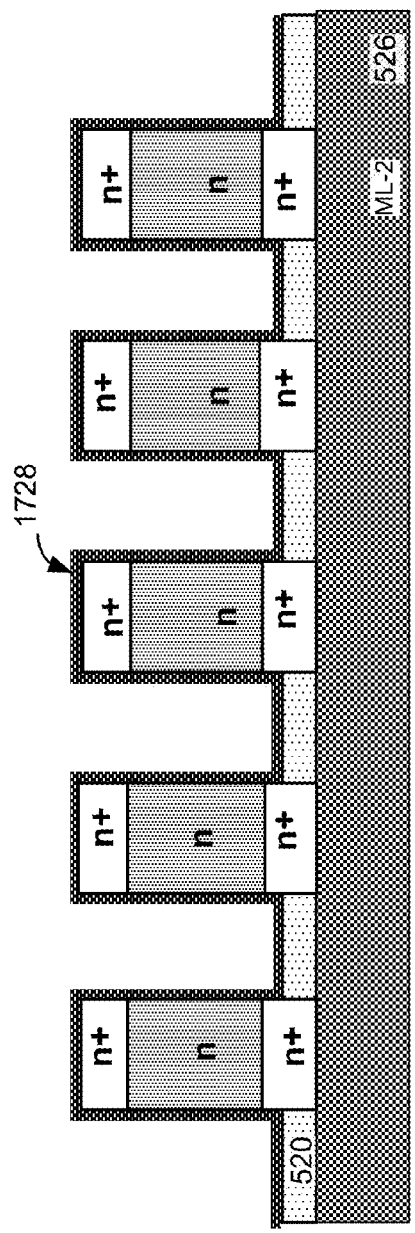

In step 1510, a gate dielectric is formed. FIG. 17D depicts results after step 1510, showing the gate dielectric material 1728 over the pillars 1725. In one embodiment, the gate dielectric material 1728 is formed by ALD of silicon oxide. In one embodiment, the gate dielectric material 1728 is formed by ALD of hafnium oxide. In one example implementation, the gate dielectric layer 1728 will be approximately 3 to 10 nanometers thick.

Figure 17E:
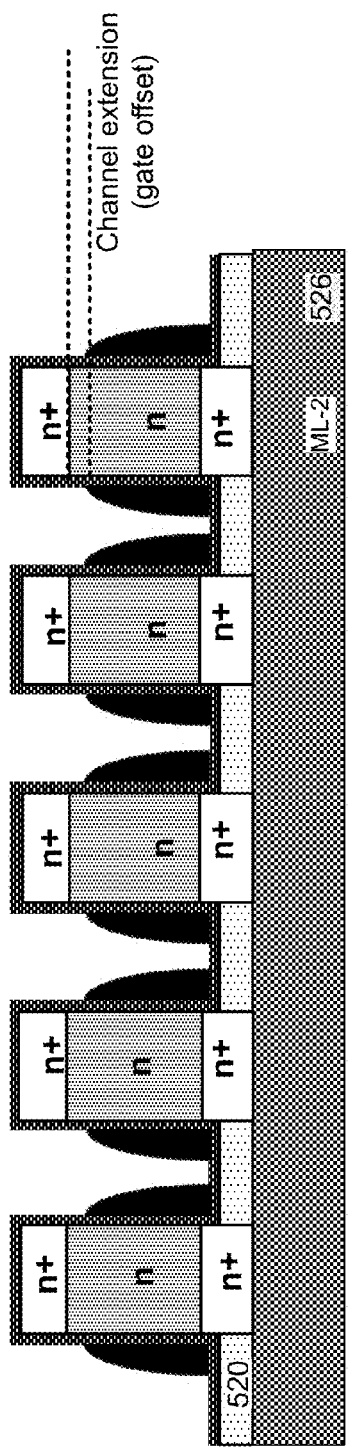

In step 1512, material is deposited for the gates. In one embodiment, TiN is deposited. Other materials can be used, including but not limited to, tungsten and doped polysilicon. In step 1514, the gate material is etched to form the gates. This may be a sidewall spacer etch. For example, reactive ion etching (RIE) is used. FIG. 17E depicts results after step 1514, showing gates 507. In this embodiment, each TFT 504 has two gates 507. In another embodiment, a TFT 504 has a single gate. In one embodiment, the TiN is deposited over the gate dielectric material 1625 in a more or less conformal layer. Etching back the gate material (e.g., TiN) creates the structure of FIG. 17E. The channel extension is at the upper portion of the TFTs 504. As noted above, the process can be modified such that no channel extension is formed at the top of the TFT 504. The no channel extension at the top can be in combination with no channel extension at the bottom or with a channel extension at the bottom.

Figure 17F:
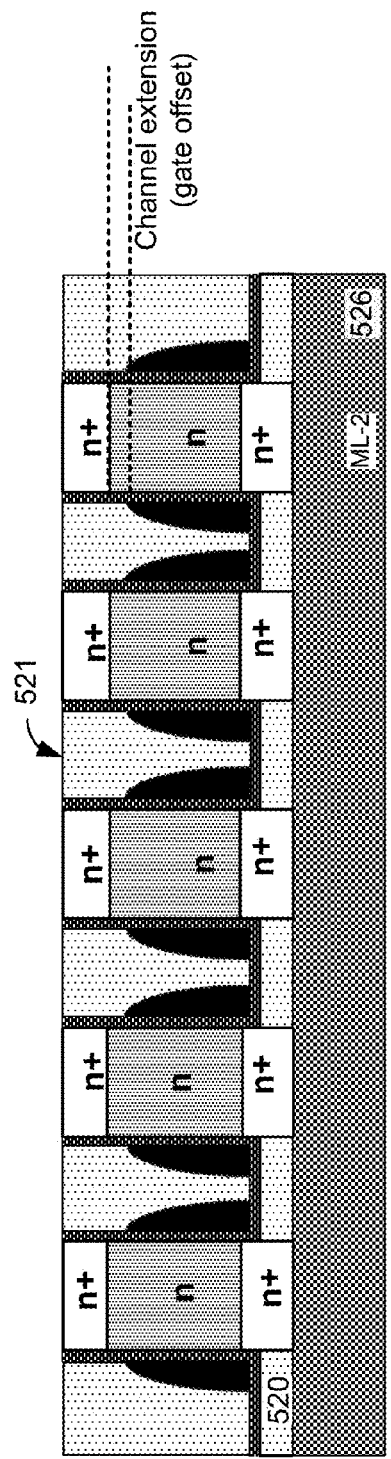

In step 1516, another layer of oxide is formed. In step 1518, the oxide is etched back. FIG. 17F depicts results after step 1518, depicting additional oxide layer 521.

A vertical TFT selection device with channel extension provides an additional controlled parameter (channel extension or gate/junction offset) as a powerful way of optimizing vertical TFT selection device trade-offs (e.g., Ion, Ioff/leakage and Breakdown Voltage), by modulating the top and bottom gate/junction overlap/offset.

Another advantage of a vertically asymmetrical TFT having channel extension is that it can have a lower aspect ratio than a vertically symmetrical TFT. As the foregoing indicates, the vertically asymmetrical TFT can be made shorter than a vertically symmetrical TFT without sacrificing leakage current or breakdown voltage. Thus, the aspect ratio can be improved.

Figure 18:
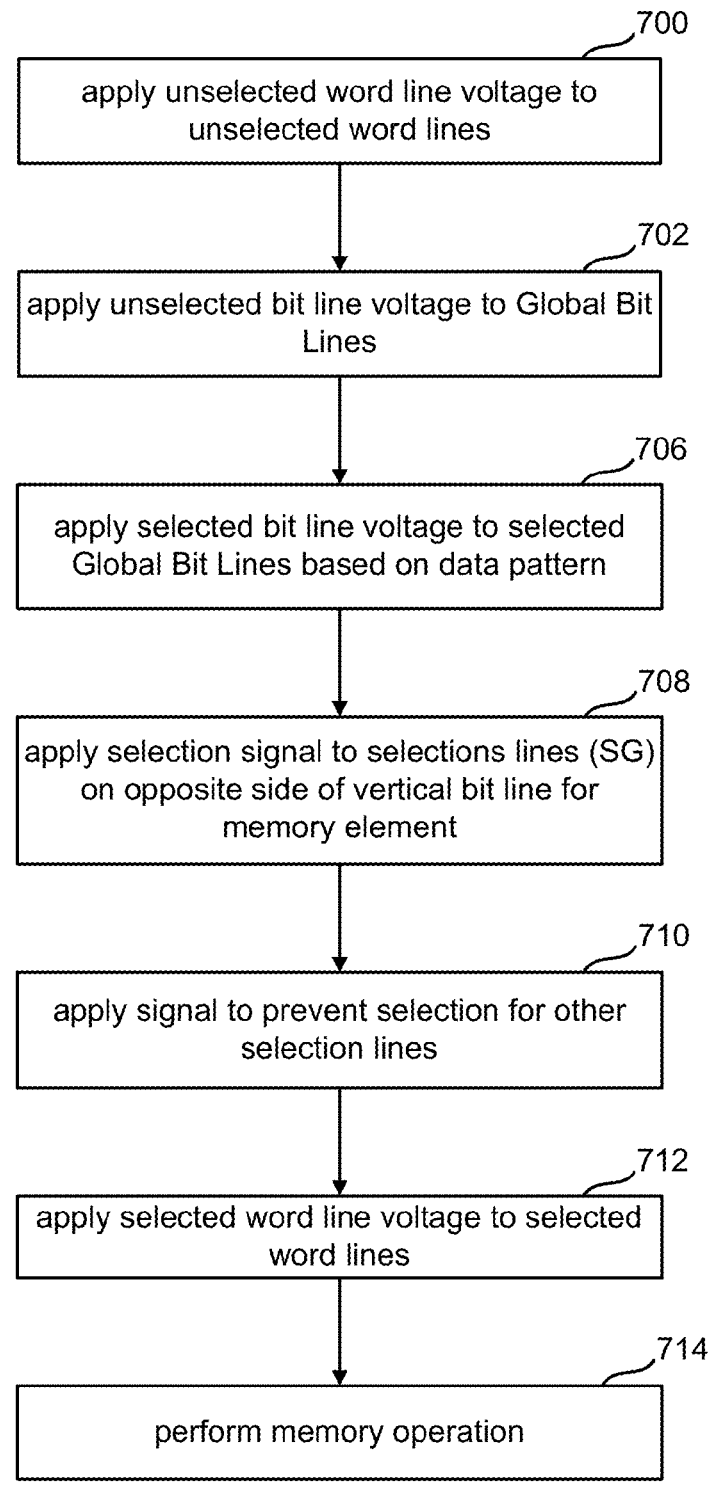
FIG. 18 is a flow chart describing one embodiment of a process for operating a 3D memory array having a vertical TFT selection device.

FIG. 18 is a flow chart describing one example process for operating the memory device of the embodiment where memory elements are chosen by driving row select lines on the opposite side of the vertical bit lines. In step 700 of FIG. 18, the unselected word line voltage is applied to the unselected word lines. In step 702, the unselected bit line voltage is applied to all the global bit lines. In one embodiment, the local bit lines are floated, so they drift toward (or to) the unselected word line voltage. In step 706, the selected bit line voltage is applied to selected global bit lines. In step 708, the selection signal is applied to the appropriate row select lines (SG$_x$) on the opposite side of the vertical bit lines for the memory elements that are selected. The signal applied to the row select lines is the appropriate signal to turn on the vertically oriented TFT select devices 504 in order to connect the global bit line to the local bit lines. The row select lines on the same side of the global bit line as the memory element that is selected will receive a signal that would not turn on any of the vertically oriented select devices. In step 712, the selected word line voltage is applied to selected word lines. Therefore, in step 714 the appropriate memory operation is performed. Note that the order of steps depicted in FIG. 18 can be changed.

In one embodiment, the process of FIG. 18 is performed by control circuitry (such as in FIG. 2) in communication with the global bit lines, the gates of the vertically oriented TFT select devices, and the word lines. The control circuitry applies voltages to the global bit lines, the gates of the vertically oriented TFT select devices, selected word lines, and unselected word lines to create a forward forming voltage for memory cells that are selected to undergo forming and to prevent a forming voltage for memory cells that are not to undergo forming, in one embodiment. In this embodiment, the vertically oriented TFT select devices may have the channel extension on the bottom, as in FIG. 12B.

In one embodiment, the control circuitry applies voltages to the global bit lines, the gates of the vertically oriented TFT select devices, selected word lines, and unselected word lines to create a reverse forming voltage for memory cells that are selected to undergo forming and to prevent a forming voltage for memory cells that are not to undergo forming. In this embodiment, the vertically oriented TFT select devices may have the channel extension on the top, as in FIG. 12C.

One embodiment includes a non-volatile storage system, comprising a three dimensional memory array of memory cells, a plurality of word lines coupled to the memory cells, a plurality of global bit lines, a plurality of vertically oriented bit lines coupled to the memory cells, and a plurality of vertically oriented thin film transistor (TFT) select devices. The vertically oriented TFT select devices are coupled between the vertically oriented bit lines and the global bit lines. When the vertically oriented TFT select devices are activated, the vertically oriented bit lines are in communication with the global bit lines. Each of the vertically oriented TFT select devices comprises a body formed from a wide energy band gap semiconductor.

One embodiment includes a method for forming a non-volatile storage system. The method comprises forming a three dimensional memory array of memory cells, forming a plurality of word lines coupled to a subset of the memory cells, forming a plurality of global bit lines, forming a plurality of vertically oriented bit lines coupled to the memory cells, and forming a plurality of vertically oriented thin film transistor (TFT) select devices. The vertically oriented TFT select devices are coupled between the vertically oriented bit lines and the global bit lines. When the vertically oriented TFT select devices are activated the vertically oriented bit lines are in communication with the global bit lines. Forming each of the vertically oriented TFT select devices comprises: forming a body that includes a wide band gap semiconductor, forming a gate, and forming a gate dielectric between the gate and the body.

One embodiment includes a non-volatile storage system, comprising a substrate, a three dimensional memory array of ReRAM memory cells positioned above the substrate, a plurality of word lines coupled to the ReRAM memory cells, a plurality of global bit lines, a plurality of vertically oriented bit lines coupled to the memory cells, and a plurality of vertically oriented thin film transistor (TFT) select devices that are above the substrate. The vertically oriented TFT select devices are coupled between the vertically oriented bit lines and the global bit lines. When the vertically oriented TFT select devices are activated the vertically oriented bit lines are in communication with the global bit lines. Each of the vertically oriented TFT select devices comprises a body formed from an oxide semiconductor. The body extends between a first of the global bit lines and a first of the vertically oriented bit lines. The body has a sidewall. Each of the vertically oriented TFT select devices further comprises a gate dielectric on the sidewall of the body and a gate adjacent to the gate dielectric.

Numerous examples were discussed herein in which the TFT 505 was an n+/n-type/n+ device. However, the TFT 504 may have other conductivities and other doping concentrations. Other examples include, but are not limited to, p+/p-type/p+, n+/p-type/n+, and p+/n-type/p+.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

What is claimed is:

1. A method for forming a non-volatile storage system, the method comprising:
    forming a three dimensional memory array of memory cells above a substrate;
    forming a plurality of word lines coupled to a subset of the memory cells;
    forming a plurality of global bit lines;
    forming a plurality of vertically oriented bit lines coupled to the memory cells, wherein the vertically oriented bit lines are oriented vertically with respect to the substrate; and
    forming a plurality of vertically oriented thin film transistor (TFT) select devices, wherein the vertically oriented TFT select devices are oriented vertically with respect to the substrate;
    wherein forming each of the vertically oriented TFT select devices comprises:
        forming a first source/drain electrically coupled to a first global bit line of the global bit lines;
        forming a body that includes a wide band gap semiconductor having an energy band gap greater than 1.1 eV;
        forming a second source/drain electrically coupled to a first vertically oriented bit line of the vertically oriented bit lines;
        forming a gate; and
        forming a gate dielectric between the gate and the body;
    forming a plurality of select lines, wherein each of the select lines is coupled to the gates of a group of the plurality of vertically oriented TFT select devices; and
    forming a plurality of select line drivers associated with the plurality of select lines, each of the select line drivers configured to apply a signal to its associated select line to cause a given vertically oriented TFT select device to connect or disconnect its associated vertically oriented bit line to or from its associated global bit line.

2. The method of claim 1, wherein the forming the body that includes the wide band gap semiconductor comprises forming a region of oxide semiconductor.

3. The method of claim 1, wherein the forming the body that includes the wide band gap semiconductor comprises forming the body from a metal oxide semiconductor.

4. The method of claim 1, wherein the forming the body that includes the wide band gap semiconductor comprises forming the body from a material that includes indium.

5. The method of claim 1, wherein forming the first source/drain and forming the second source/drain comprises:
    doping the wide band gap semiconductor either N+ or P+ to form the first source/drain and doping the wide band gap semiconductor either N+ or P+ to form the second source/drain to have the same conductivity as the first source/drain, the body having a lower impurity concentration than the first and second source/drains.

6. The method of claim 1, wherein forming the wide band gap semiconductor comprises:
    forming the body without providing an impurity to dope the wide band gap semiconductor, wherein the body is intrinsic.

7. The method of claim 1, wherein forming the first source/drain and forming the second source/drain comprises:
    forming a first metal region directly connected to the wide band gap semiconductor that forms the body; and
    forming a second metal region directly connected to the wide band gap semiconductor that forms the body.

8. The method of claim 7, wherein forming the vertically oriented TFT select device further comprises:
    forming the body and the gate such that the body extends past the gate to form a channel extension where the gate is not adjacent to the body.

9. A method for forming a non-volatile storage system, the method comprising:
    forming a three dimensional memory array of ReRAM memory cells above a substrate;
    forming a plurality of word lines coupled to a subset of the ReRAM memory cells;
    forming a plurality of global bit lines;
    forming a plurality of vertically oriented bit lines coupled to the memory cells, wherein the vertically oriented bit lines are oriented vertically with respect to the substrate; and
    forming a plurality of vertically oriented thin film transistor (TFT) select devices, wherein the vertically oriented TFT select devices are oriented vertically with respect to the substrate;
    wherein forming each of the vertically oriented TFT select devices comprises:
        forming a first source/drain that is an oxide semiconductor and that is electrically coupled to a first global bit line of the global bit lines;
        forming a body that is the oxide semiconductor;
        forming a second source/drain that is the oxide semiconductor and is electrically coupled to a first vertically oriented bit line of the vertically oriented bit lines;
        forming a gate; and
        forming a gate dielectric between the gate and the body;
    forming a plurality of select lines, wherein each of the select lines is coupled to the gates of a group of the plurality of vertically oriented TFT select devices; and
    forming a plurality of select line drivers associated with the plurality of select lines, each of the select line drivers configured to apply a signal to its associated select line to cause a given vertically oriented TFT select device to connect or disconnect its associated vertically oriented bit line to or from its associated global bit line.

10. The method of claim 9, wherein the forming the body that is the oxide semiconductor comprises forming the body from a wide band gap semiconductor having an energy band gap greater than 1.1 eV.

11. The method of claim 9, wherein the forming the body that is the oxide semiconductor comprises forming the body from a metal oxide semiconductor.

12. The method of claim 9, wherein the forming the body that is the oxide semiconductor comprises forming the body from a material that includes indium.

13. The method of claim 9, wherein forming the first source/drain and forming the second source/drain comprises:
    doping the oxide semiconductor either N+ or P+ to form the first source/drain and doping the oxide semiconductor either N+ or P+ to form the second source/drain to have the same conductivity as the first source/drain, the body having a lower impurity concentration than the first and second source/drains.

14. The method of claim 13, wherein forming the vertically oriented TFT select device further comprises:
    forming the body and the gate such that the body extends past the gate to form a channel extension where the gate is not adjacent to the body.

15. A method for forming a non-volatile storage system, the method comprising:
    forming a three dimensional memory array of ReRAM memory cells above a substrate;
    forming a plurality of word lines coupled to a subset of the ReRAM memory cells;
    forming a plurality of global bit lines;
    forming a plurality of vertically oriented bit lines coupled to the memory cells, wherein the vertically oriented bit lines are oriented vertically with respect to the substrate; and
    forming a plurality of vertically oriented thin film transistor (TFT) select devices, wherein the vertically oriented TFT select devices are oriented vertically with respect to the substrate;
    wherein forming each of the vertically oriented TFT select devices comprises:
        forming a first source/drain that is a metal and that is electrically coupled to a first global bit line of the global bit lines;
        forming a body that is an oxide semiconductor that is in direct contact with the metal of the first source/drain;
        forming a second source/drain that is a metal that is in direct contact with the oxide semiconductor of the body and is electrically coupled to a first vertically oriented bit line of the vertically oriented bit lines;
        forming a gate; and
        forming a gate dielectric between the gate and the body;
    forming a plurality of select lines, wherein each of the select lines is coupled to the gates of a group of the plurality of vertically oriented TFT select devices; and
    forming a plurality of select line drivers associated with the plurality of select lines, each of the select line drivers configured to apply a signal to its associated select line to cause a given vertically oriented TFT select device to connect or disconnect its associated vertically oriented bit line to or from its associated global bit line.

16. The method of claim 15, wherein the forming the body that is the oxide semiconductor comprises forming the body from a wide band gap semiconductor having an energy band gap greater than 1.1 eV.

17. The method of claim 15, wherein the forming the body that is the oxide semiconductor comprises forming the body from a metal oxide semiconductor.

18. The method of claim 15, wherein the forming the body that is the oxide semiconductor comprises forming the body from a material that includes indium.

19. The method of claim 15, wherein the three dimensional memory array is a monolithic three dimensional memory array comprising multiple memory levels above the substrate.

20. The method of claim 5, wherein forming the vertically oriented TFT select device further comprises:
    forming the body and the gate such that the body extends past the gate to form a channel extension where the gate is not adjacent to the body.

* * * * *